US012322522B2

(12) United States Patent
Levy

(10) Patent No.: US 12,322,522 B2
(45) Date of Patent: *Jun. 3, 2025

(54) LOW-VOLTAGE ELECTRON BEAM CONTROL OF CONDUCTIVE STATE AT A COMPLEX-OXIDE INTERFACE

(71) Applicant: University of Pittsburgh—Of the Commonwealth System of Higher Education, Pittsburgh, PA (US)

(72) Inventor: Jeremy Levy, Pittsburgh, PA (US)

(73) Assignee: University of Pittsburgh—Of the Commonwealth System of Higher Education, Pittsburgh, PA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/395,196

(22) Filed: Dec. 22, 2023

(65) Prior Publication Data

US 2024/0412889 A1 Dec. 12, 2024

Related U.S. Application Data

(63) Continuation of application No. 17/917,669, filed as application No. PCT/US2021/017644 on Feb. 11, 2021, now Pat. No. 11,894,162.

(Continued)

(51) Int. Cl.
*G21K 5/04* (2006.01)
*H01J 37/147* (2006.01)

(Continued)

(52) U.S. Cl.
CPC ............. *G21K 5/04* (2013.01); *H01J 37/147* (2013.01); *H01J 37/28* (2013.01);

(Continued)

(58) Field of Classification Search
CPC .......... G21K 5/04; H01J 37/147; H01J 37/28; H01J 37/3174; H01J 2237/004;

(Continued)

(56) References Cited

U.S. PATENT DOCUMENTS 5,240,906 A * 8/1993 Bednorz .............. H10N 60/207
427/63
7,999,248 B2 * 8/2011 Levy ................... H01L 29/0673
257/E51.023

(Continued)

OTHER PUBLICATIONS

C. Cen et al., "Nanoscale control of an interfacial metal-insulator transition at room temperature," Nature Materials vol. 7, pp. 298-302 (Mar. 2008).

(Continued)

*Primary Examiner* — David A Vanore
(74) *Attorney, Agent, or Firm* — Foley & Lardner LLP

(57) ABSTRACT

Described is a method comprising directing an ultra-low voltage electron beam to a surface of a first insulating layer. The first insulating layer is disposed on a second insulating layer. The method includes modifying, by the application of the ultra-low voltage electron beam, the surface of the first insulating layer to selectively switch an interface between a first state having a first electronic property and a second state having a second electronic property.

18 Claims, 19 Drawing Sheets

Related U.S. Application Data

(60) Provisional application No. 63/009,211, filed on Apr. 13, 2020.

(51) Int. Cl.

| | | |
|---|---|---|
| *H01J 37/28* | (2006.01) | |
| *H01J 37/317* | (2006.01) | |
| *H10N 52/01* | (2023.01) | |
| *H10N 60/01* | (2023.01) | |
| *H10N 60/30* | (2023.01) | |
| *H10N 70/00* | (2023.01) | |
| *H10N 70/20* | (2023.01) | |

(52) U.S. Cl.
CPC ......... *H01J 37/3174* (2013.01); *H10N 52/01* (2023.02); *H10N 60/01* (2023.02); *H10N 60/30* (2023.02); *H10N 70/041* (2023.02); *H10N 70/257* (2023.02); *H01J 2237/004* (2013.01)

(58) Field of Classification Search
CPC ........ H10N 52/01; H10N 60/01; H10N 60/30; H10N 70/041; H10N 70/257
See application file for complete search history.

(56) References Cited

U.S. PATENT DOCUMENTS

| | | | | |
|---|---|---|---|---|
| 8,748,950 | B2* | 6/2014 | Levy | H01L 29/78 257/29 |
| 9,899,372 | B1* | 2/2018 | Bi | H01L 28/82 |
| 10,580,872 | B2* | 3/2020 | Eom | H01L 29/66969 |
| 11,894,162 | B2* | 2/2024 | Levy | H01J 37/147 |
| 2008/0237578 | A1* | 10/2008 | Levy | H01L 29/0673 257/E29.06 |
| 2017/0167012 | A1* | 6/2017 | Eom | C23C 14/545 |
| 2018/0337238 | A1* | 11/2018 | Eom | H01L 29/778 |
| 2019/0198403 | A1* | 6/2019 | Fang | G03F 7/70683 |

OTHER PUBLICATIONS

Krivoshapkina, et al., "Low-energy Electron Exposure of Ultrathin Polymer Films with Scanning Probe Lithography," Microelectronic Engineering, vol. 177, pp. 78-86 (Feb. 2017).

Gariglio, "Research Update: Conductivity and Beyond at the LaAlO3/S1TiO3 Interface." APL Materials 4, 060701, 15 pages (Jun. 2016).

Aurino, et al., "Nano-patterning of the Electron Gas at the LaAlO3/StTiO3 Interface Using Low-Energy Ion Beam Irradiation," Applied Physics Letters, vol. 102(20), p. 201610, 4 pages (May 2013).

International Preliminary Report on Patentability issued in International Patent Application No. PCT/US2021/017644, dated Oct. 27, 2022.

Lee et al., "Electron beam induced epitaxial crystallization in a conducting and insulating a-LaAIO/SrTiO3 system," Royal Society of Chemistry Advances, Aug. 2017, vol. 7, No. 64 (pp. 40279-40285).

Gemma Rius Suñé, Electron Beam Lithography for Nanofabrication, Department de Fisica, Facultat de Ciencies, University of Barcelona, Jan. 2008, 127 pages.

Tomczyk, et al., "Electrostatically Tuned Dimensional Crossover in $LaAlO_3/SrTiO_3$ Heterostructures," *APL Materials*, vol. 5, 106107-1-106107-8 (Oct. 2017).

Pham, "Fabrication of Single Nanowire Device using Electron Beam Lithography," Graduate Theses and Dissertations, Univ. of Arkansas, May 31, 2014, 128 pages.

Brown, et al., "Giant Conductivity Switching of $LaAlO_3/SrTiO_3$ Heterointerfaces Governed by Surface Protonation," *Nature Communications*, vol. 7, No. 1, pp. 1-6 (Feb. 2016).

Singh, et al., "Nanopatterning of Weak Links in Superconducting Oxide Interfaces," *Nanomaterials*, vol. 11, No. 398, pp. 1-11 (Feb. 2021).

Yang, et al., "Nanoscale Control of LaAlO3/SrTiO3 Metal-Insulator Transition Using Ultra-Low-Voltage Electron-Beam Lithography," Applied Physics Letters, vol. 117, No. 25, 12 pages (Dec. 2020).

International Search Report and Written Opinion issued in International Patent Application No. PCT/US2021/017644, May 23, 2021.

Communication issued in co-pending European Patent Application No. 21787847, dated Apr. 8, 2024 (8 pages).

Jnawali et al., "Graphene-Complex-oxide Nanoscale Device Concepts," arxiv.org, Cornell University Library, 201 Olin Library Cornell University, Ithaca, NY 14853, Jun. 30, 2017 (27 pages).

Lee et al., "Atomic and Electronic Reconstruction at the a-LAO/STO Interface by E-Beam Induced Crystallization," Microscopy and Microanalysis, Aug. 1, 2019, vol. 25, No. S2 (pp. 1894-1895).

J.W. Park et al., "Creation of a two-dimensional electron gas at an oxide interface on silicon", *Nature Communications*, Oct. 19, 2010, pp. 1-6, vol. 1, No. 94 (7 pages).

* cited by examiner

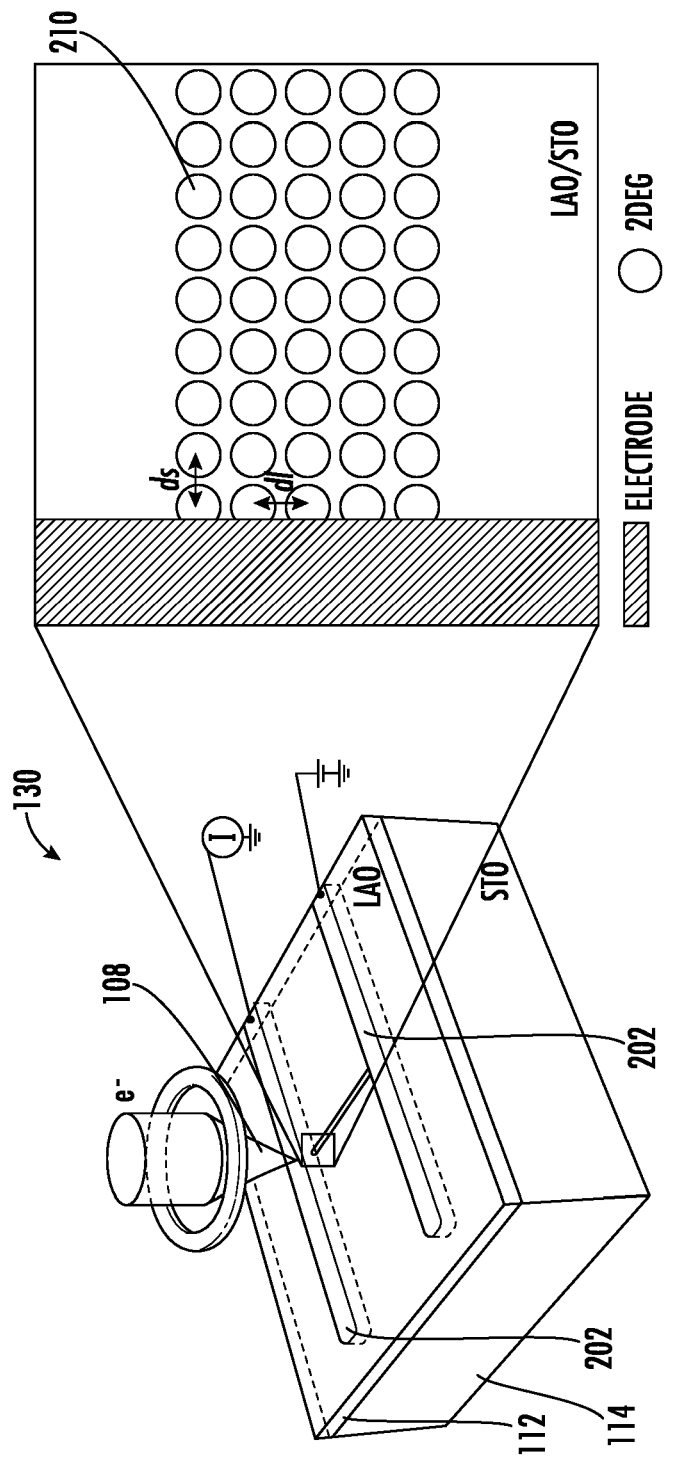

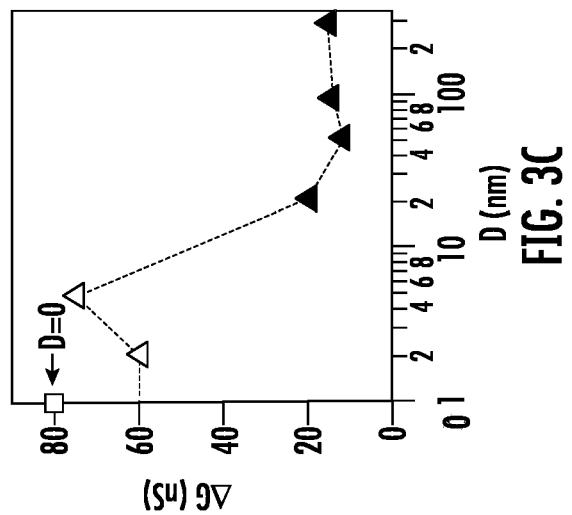
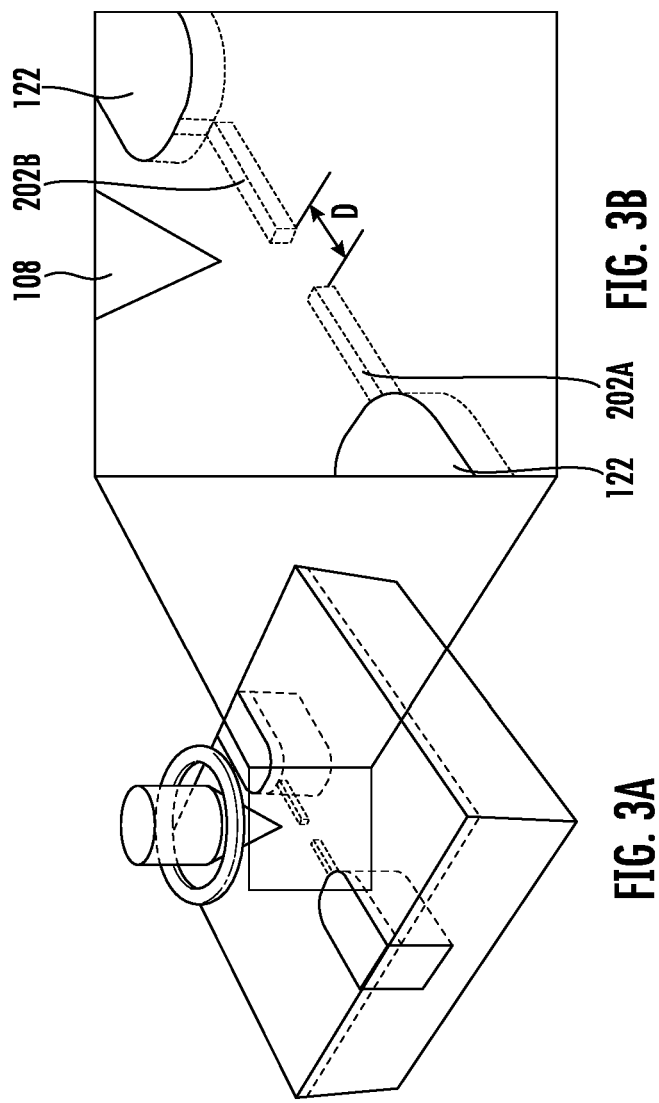
FIG. 3C
FIG. 3B
FIG. 3A

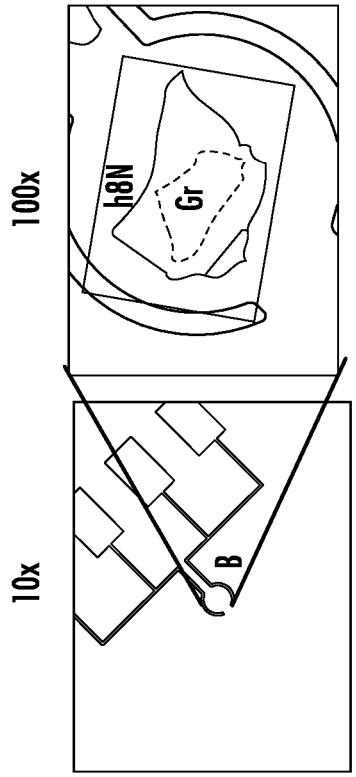
FIG. 7A
FIG. 7B
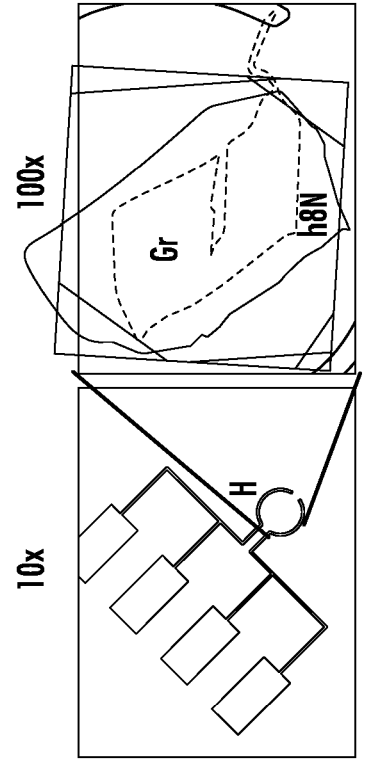
FIG. 7C
FIG. 7D
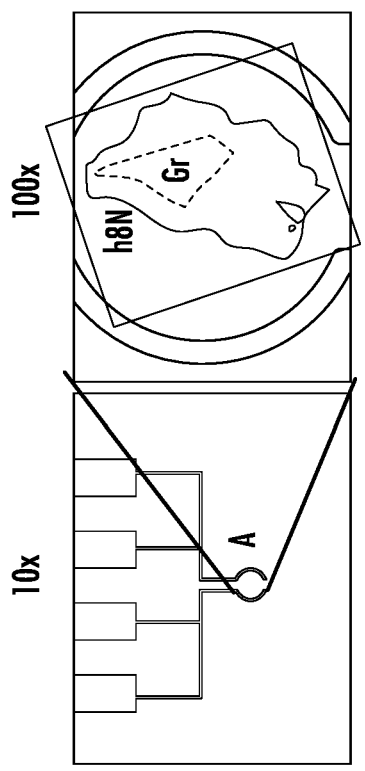
FIG. 7E
FIG. 7F
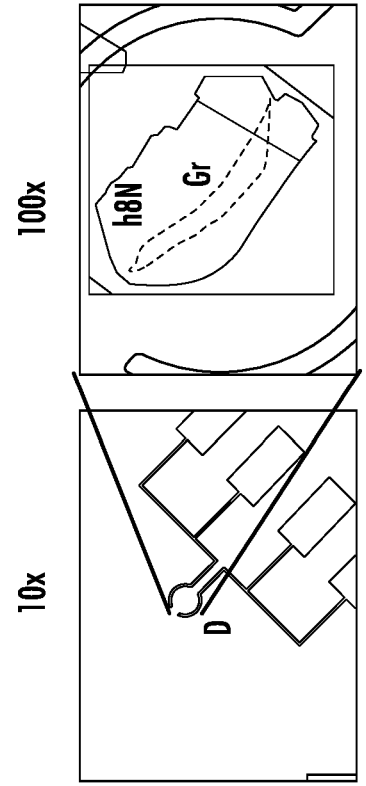
FIG. 7G
FIG. 7H

LOW-VOLTAGE ELECTRON BEAM CONTROL OF CONDUCTIVE STATE AT A COMPLEX-OXIDE INTERFACE

CROSS-REFERENCE TO RELATED APPLICATIONS

This application is a continuation of U.S. application Ser. No. 17/917,669, filed Oct. 7, 2022, which is the U.S. National Stage of International Patent Application No. PCT/US2021/017644, filed Feb. 11, 2021, which claims priority from U.S. Provisional Patent Application No. 63/009,211, filed Apr. 13, 2020. The contents of these applications are incorporated herein by reference in their entirety.

STATEMENT REGARDING FEDERALLY SPONSORED RESEARCH OR DEVELOPMENT

This invention was made with government support under Grant No. N00014-15-1-2847 awarded by the U.S. Department of the Navy. The government has certain rights in the invention.

TECHNICAL FIELD

This disclosure relates to oxide structures and to the behavior of an interface between such structures.

BACKGROUND

A two-dimensional electron liquid forms at an interface between two insulating non-magnetic oxides $LaAlO_3$ ("LAO") and $SrTiO_3$ ("STO"). The interface exhibits a variety of electrical phenomena and has variable properties.

There is a need in the art for new devices, systems and methods involving control of an interface between two insulating non-magnetic oxides. The present disclosure satisfies this need.

SUMMARY

The present disclosure relates to devices, systems and methods involving control of an interface between two insulating non-magnetic oxides, for example, $LaAlO_3$ ("LAO") and $SrTiO_3$ ("STO"). The material properties of exemplary interfaces between these oxides is characterized by a variety of phenomena including superconductivity, strong Rashba-like spin-orbit coupling, and ferromagnetism.

The present disclosure further relates to techniques for reversible ultra-low-voltage electron-beam lithography (ULV-EBL)-based patterning of the metal-insulator transition in LAO/STO and graphene/LAO/STO heterostructures. The technique allows for resolutions smaller than about 10 nm and for creation of nanostructures exhibiting desired properties at low temperatures, such as superconductivity. The ULV-EBL techniques disclosed herein provide for higher writing speeds and scalability, and are conducive to the development of more complex families of quantum devices, including arrays of THz and optical photodetectors, and graphene-based nanodevices, for example.

An embodiment of the present disclosure provides a method of directing an ultra-low voltage electron beam to a surface of a first insulating layer. The first insulating layer is disposed on a second insulating layer. The method includes modifying, by the application of the ultra-low voltage (ULV) electron beam, the surface of the first insulating layer to thereby selectively switch an interface between a first state having a first electronic property and a second state having a second electronic property, the interface being between the first insulating layer and the second insulating layer.

In one aspect of the methods described herein, the first state is an insulating state and the second state is a conductive state. In another aspect, the first state is a first conductive state and the second state is a second conductive state.

In another aspect of the methods described herein, the method further comprises writing a conductive line at the interface at a speed of greater than about 0.1 mm/sec and less than about 15 mm/sec.

In one embodiment, modifying the surface of the first insulating layer includes modifying a portion of the surface of the first insulating layer, the portion of the surface of the first insulating layer having a feature size of greater than or equal to about 2 nanometers and less than or equal to about 200 nanometers.

In another embodiment, in the methods described herein, the interface is modifiable to attain at least one of an insulating state, a conducting state, a superconducting state, a ferroelectric state, or a ferromagnetic state.

In another embodiment, the methods described herein may further include directing the ultra-low voltage electron beam through an overlayer disposed on the first insulating layer. In one aspect, the overlayer comprises graphene.

In one embodiment, the methods described herein further comprise writing a nanowire at the interface.

In another embodiment, the first insulating layer comprises $LaAlO_3$ and the second insulating layer comprises $SrTiO_3$. In another embodiment, the first insulating layer comprises $SrTiO_3$ and the second insulating layer comprises $LaAlO_3$.

Another embodiment of the present disclosure provides a reconfigurable device that includes a first insulating layer and a second insulating layer. The reconfigurable device includes an interface between the first insulating layer and the second insulating layer. The reconfigurable device also includes an overlayer disposed on the first insulating layer. An electronic property of the interface is modifiable in response to an ultra-low voltage electron beam being directed to the first insulating layer.

In one embodiment of such a reconfigurable device, the first insulating layer comprises $LaAlO_3$. In another embodiment, the second insulating layer comprises $SrTiO_3$. Further, the overlayer may include graphene.

In yet another embodiment of the reconfigurable device, the first insulating layer comprises a compound selected from the group consisting of $LaAlO_3$, $SrTiO_3$, $LaTiO_3$, $LaVO_3$, $KTaO_3$, $CaZrO_3$, and $\alpha$-$Al_2O_3$.

Another embodiment of the present disclosure provides an electronic assembly that includes one or more device electrodes. The electronic assembly includes one or more interface electrodes configured to be coupled with the one or more device electrodes. The electronic assembly includes a first insulating layer and a second insulating layer. The electronic assembly also includes an interface between the first insulating layer and the second insulating layer. The interface is coupled with the one or more interface electrodes. The electronic assembly includes an overlayer disposed on the first insulating layer. In addition, the electronic assembly is reconfigurable by directing an ultra-low voltage electron beam to the first insulating layer.

In one aspect, the overlayer comprises graphene. In another aspect, first insulating layer comprises $LaAlO_3$ and the second insulating layer comprises $SrTiO_3$.

Both the foregoing summary and the following description of the drawings and detailed description are exemplary and explanatory. They are intended to provide further details of the invention, but are not to be construed as limiting. Other objects, advantages, and novel features will be readily apparent to those skilled in the art from the following detailed description of the invention.

BRIEF DESCRIPTION OF THE DRAWINGS

FIG. 2D illustrates a schematic of a reconfigurable device and a low-voltage electron beam in accordance with one or more embodiments shown and described herein.

FIG. 2E illustrates a two-dimensional electron gas (2DEG) nanowire geometry in accordance with one or more embodiments shown and described herein.

FIG. 3A illustrates a schematic of a $LaAlO_3/SrTiO_3$ heterostructure with wires in accordance with one or more embodiments shown and described herein.

FIG. 3B illustrates a detailed schematic of the $LaAlO_3/SrTiO_3$ heterostructure of FIG. 3A in accordance with one or more embodiments shown and described herein.

FIG. 3C illustrates a graph of conductance as a function of separation distance in accordance with one or more embodiments shown and described herein.

FIG. 7A illustrates a schematic of a reconfigurable device on hBN/graphene/LAO/STO in accordance with one or more embodiments shown and described herein.

FIG. 7B illustrates a schematic of the reconfigurable device of FIG. 7A in accordance with one or more embodiments shown and described herein.

FIG. 7C illustrates a schematic of a reconfigurable device on hBN/graphene/LAO/STO in accordance with one or more embodiments shown and described herein.

FIG. 7D illustrates a schematic of the reconfigurable device of FIG. 7C in accordance with one or more embodiments shown and described herein.

FIG. 7E illustrates a schematic of a reconfigurable device on hBN/graphene/LAO/STO in accordance with one or more embodiments shown and described herein.

FIG. 7F illustrates a schematic of the reconfigurable device of FIG. 7E in accordance with one or more embodiments shown and described herein.

FIG. 7G illustrates a schematic of a reconfigurable device on hBN/graphene/LAO/STO in accordance with one or more embodiments shown and described herein.

FIG. 7H illustrates a detailed schematic of the reconfigurable device of FIG. 7G in accordance with one or more embodiments shown and described herein.

Like reference numbers and designations in the various drawings indicate like elements.

DETAILED DESCRIPTION

I. Overview

Figure 1:
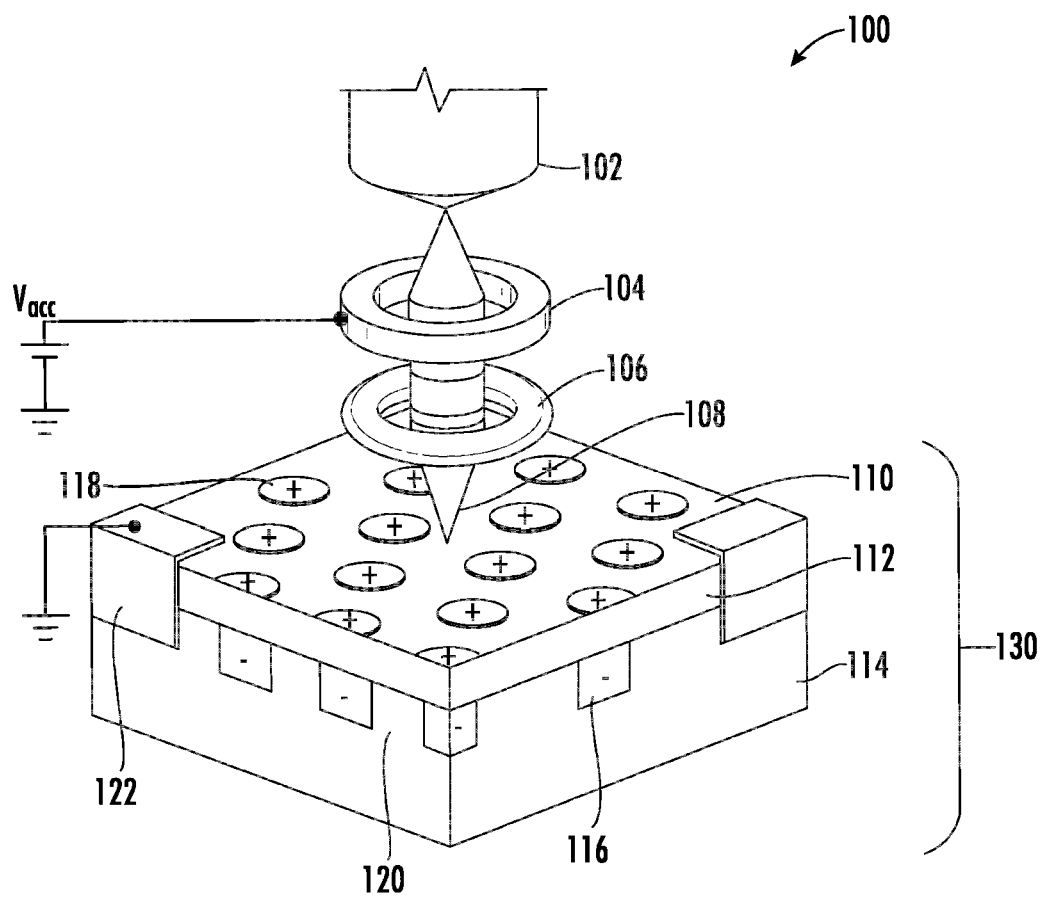
FIG. 1 illustrates a schematic of a reconfigurable device and low-voltage electron beam in accordance with one or more embodiments shown and described herein.

The present disclosure is directed to novel techniques to reconfigure the electronic properties of a two-dimensional (2D) complex-oxide interface with unprecedented flexibility and spatial resolution. In particular, a low-voltage electron beam is employed, allowing an exemplary $LaAlO_3/SrTiO_3$ interface to be reversibly switched among insulating, conducting, superconducting, ferroelectric, and ferromagnetic states, with a spatial resolution (e.g., about two nm or other resolution described herein) that is comparable to the average spacing between individual electrons.

Approaches to quantum materials and quantum matter simulation may involve synthesis and control of highly configurable quantum systems that obey quantum equations. In particular, one approach involves the creation of artificial atomic lattices by trapping single atoms in standing waves of light. The theoretical models that describe these systems (e.g., the "Fermi-Hubbard" model) aid in understanding the behavior of high-temperature superconductors. Further, quantum simulation and related quantum fields may include atomic and optical approaches. Certain embodiments disclosed herein exhibit quantum material behavior, as apparent from the following discussion.

Reference is made below to various embodiments, which are illustrated in the accompanying drawings. Whenever possible, the same reference numerals are used throughout the drawings to refer to identical, functionally similar and/or structurally similar parts. The components in the drawings are not necessarily to scale, with emphasis instead being placed upon illustrating the principles of the exemplary embodiments.

Various embodiments of systems and methods for controlling a conductive state at a complex-oxide interface using a low-voltage electron beam are described herein. Scalable synthetic quantum materials may be created using a reconfigurable oxide nanoelectronics platform. For example, an exemplary system may include an oxide heterostructure made from a thin layer of $LaAlO_3$ and a thick layer of $SrTiO_3$. The system may include a scanning electron microscope (SEM) that operates at ultra-low voltages (e.g., as low as about 10 V, about 11 V, about 12 V, about 13 V, about 14 V, about 15 V, or any other suitable low voltage) while maintaining high resolution (e.g., less than about 10 nm, e.g., about 2 nm). In other aspects, the resolution can be maintained at or less than about 9 nm, at or less than about 8 nm, at or less than about 7 nm, at or less than about 6 nm, at or less than about 5 nm, at or less than about 4 nm, at or less than about 3 nm, or at or less than about 2 nm. In one aspect, the high resolution is maintained above about 0.1 nm and below any value described herein.

An ultra-low voltage scanning electron microscope (ULV-SEM) configured for lithography is configured to create nanostructures approximately 103 times faster than with an atomic force microscope (AFM).

The complex $LaAlO_3/SrTiO_3$ (LAO/STO) oxide heterostructure exhibits a wide range of physical phenomena that are attributable at least in part to the properties of the STO system. When a thin layer (e.g., less than or equal to about 4 unit cells) of LAO is grown on $TiO_2$-terminated STO, a two-dimensional electron gas may spontaneously form at the interface. This system may exhibit, under various conditions, one or more of properties such as superconductivity, magnetism, gate-tunable spin-orbit interactions, and a tunable metal-insulator transition or any combination thereof. The metal-insulator transition is controllable by light, ion beam irradiation, applied back gate voltages, and conductive atomic force microscope (c-AFM) lithography or any combination thereof.

C-AFM lithography facilitates precise nanoscale control of the metal-insulator transition in LAO/STO. The technique involves a water cycle, e.g., selectively removing $OH^-$ from adsorbed water on the LAO surface, and allowing the remaining $H^+$ ions to dope the LAO/STO interface. Applying a positive voltage to the c-AFM tip locally switches the LAO/STO interface to a conductive state, while negative voltages restore the insulating phase. The c-AFM technique may be applied to complex oxide systems and at the two-dimensional electron gas (2DEG) interface to create ballistic nanowires, electron waveguides, single-electron transistors, for example. Practical limitations on c-AFM lithography include relatively small scan ranges (e.g., about 100 μm) and slow writing speeds (e.g., about 1 μm/s) of typical AFMs, for example.

Parallel writing with AFM tip arrays may address various limitations as outlined above and allow more complex devices to be created. Electron-beam lithographic (EBL) patterning is expected to allow larger devices with more complex layouts to be created. EBL is utilizable with a resist such as PMMA, which may generally be used with an additive or subtractive lithography step that is irreversible.

The systems and methods of the present disclosure demonstrate an approach to reversible control of the metal-insulator transition in LAO/STO heterostructures using an ultra-low voltage electron-beam lithography (ULV-EBL) technique. The low voltage electron-beam approach avoids the risk of damage associated with high-energy electron beams in highly insulating oxide materials. In particular, the electron penetration for typical (e.g., greater than or equal to about 10 keV) electron acceleration energies may damage to the oxide material. Moreover, the etching of material itself may cause uncontrolled and, in many cases, undesirable behavior in the underlying material, which is sensitive to structural distortions. The risk of damage and/or distortion may be ameliorated by using low voltage electron-beam lithography techniques as disclosed in the exemplary non-limiting embodiments herein.

In at least one embodiment, the foregoing techniques may be carried out with using e-beam resist. The techniques disclose herein allow rapid, large-scale switching of the conductivity of the LAO/STO interface, with spatial precision comparable to c-AFM lithography and with no discernible changes in the topography of the LAO/STO structure. In addition to being significantly faster than c-AFM lithography, the ULV-EBL technique facilitates patterning through van der Waals (vdW) materials such as monolayer graphene.

The ULV-EBL technique permits the combination of LAO/STO-based nanoelectronics with a wide range of 2D layered materials.

System Configuration

FIG. 1 illustrates a schematic of a system 100 including a reconfigurable device 130 and low-voltage electron beam according to at least one embodiment. The system 100 includes an electron gun 102 (e.g., an electron emitter). The electron gun 102 is configured to produce an electron beam 108 (e.g., a collimated electron beam, focused electron beam, etc.). The electron beam 108 is a low-voltage electron beam in at least one embodiment. For example, the low-voltage electron beam may be an electron beam with an accelerator voltage ($V_{acc}$) of about 200 V. In some embodiments, the accelerator voltage may be between about 100 V to about 1000 V, or any voltage in-between these two values. The accelerator voltage may also be lower. For example, the accelerator voltage may range over different values, e.g., between about 10 to about 20 V, or any value in-between these two numbers.

In at least one embodiment, the system 100 includes the reconfigurable device 130 which includes a first insulating layer 112 and a second insulating layer 114. The first insulating layer 112 is disposed on the second insulating layer 114. The first insulating layer 112 includes a surface 110. The first insulating layer 112 includes LaTiO$_3$. The electron beam 108 may penetrate through the first insulating layer 112 without damaging the first insulating layer 112. The electron beam 108 may have an accelerator voltage that is low enough to penetrate through the first insulating layer 112 without damaging the first insulating layer 112. In at least one embodiment, the second insulating layer 114 includes SrTiO$_3$. In at least one embodiment, one of the first insulating layer 112 or the second insulating layer 114, or both of the first and second layers 112, 114, includes a compound selected from the group consisting of, LaAlO$_3$, SrTiO$_3$, LaVO$_3$, KTaO$_3$, CaZrO$_3$, and α-Al$_2$O$_3$, for example, or combinations thereof.

In at least one embodiment, the reconfigurable device 130 includes an interface 120 (e.g., a barrier layer or intermediate layer, etc.). The interface 120 is disposed between the first insulating layer 112 and the second insulating layer 114. At least one electronic property of the interface 120 is modifiable in response to the electron beam 108 being directed to the first insulating layer 112. For example, electronic properties that may be modified include conductivity, conductance, and resistivity. The interface 120 includes a plane between two layers in contact with each other. The interface 120 includes a thickness of about 4 unit cells, extending from the plane, into each layer. In some embodiments, the thickness may be about 3 unit cells to about 5 unit cells, or about 2 unit cells to about 6 unit cells, for example. The interface may further include a passivation layer, such as a TiO$_2$ layer, which terminates one or both surfaces of the two layers in or around the plane of contact.

The electron beam 108 directed to the surface 110 of the first insulating layer 112 is configured to charge the surface 110. For example, the surface 110 is configured to become positively charged due to the charging of the first insulating layer 112 by the electron beam. The system 100 is configured to include protons 118 at the surface 110 of the first insulating layer 112 and electrons at the interface 120. For example, the electron beam 108 directed to the surface 110 of the first insulating layer 112 may switch the interface 120 to a conductive state. The electron beam 108 is scanned in an electrostatic manner. For example, the electron beam 108 may charge the surface 110 of the first insulating layer 112.

In at least one embodiment, the system 100 may include at least one anode 104. The at least one anode 104 may be an accelerating anode (e.g., an anode to which an accelerating voltage is applied) that is configured to accelerate the electron beam 108. The system 100 may further include at least one focusing component 106, such as a coil or a magnet, which focuses the electron beam 108. In at least one embodiment, the reconfigurable device 130 includes interface contacts 122. For example, the interface contacts 122 may include Ti/Au interface contacts in some embodiments. The interface contacts 122 may be grounded.

Oxide Heterostructure

Figure 2A:
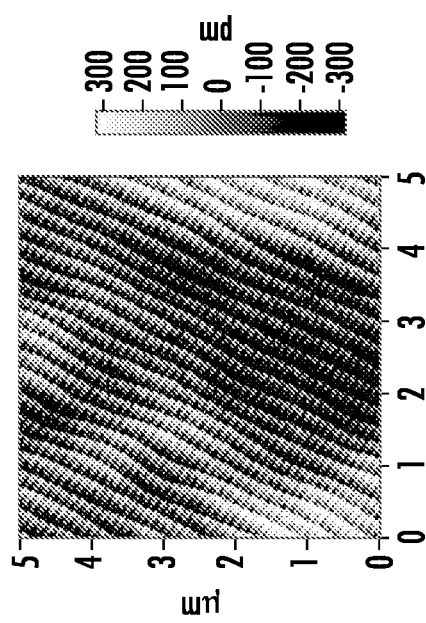
FIG. 2A illustrates the topography of a $LaAlO_3/SrTiO_3$ heterostructure in accordance with one or more embodiments shown and described herein.

FIG. 2A illustrates the topography of a LaAlO$_3$/SrTiO$_3$ heterostructure in at least one embodiment. The following discussion describes the construction and investigation of an example of such a heterostructure.

The exemplary LaAlO$_3$/SrTiO$_3$ heterostructure is a two-dimensional (2D) complex-oxide. A thin layer (e.g., about 3 to about 4 unit cells, about 3 to about 3.5 unit cells, or about 3.4 unit cells) of LAO is grown on top of the TiO$_2$-terminated STO (001) substrate by pulsed laser deposition (PLD). The LAO thickness may be determined by reflection high-energy electron diffraction (RHEED) oscillations. The LAO thickness may be controlled for c-AFM lithography such that the interface is insulating while approaching a given thickness where the insulator-to-metal transition occurs. The LAO/STO structure is initially insulating with MΩ resistance at the interface. At least one layer of Ti/Au (e.g., about 5 nm Ti and about 20 nm Au) is deposited on the structure using photolithography to form so-called "canvases" with low-resistance electrical contacts to the LAO/STO interface. The canvas may include the area defined and surrounded by the electrodes within a clear (free) area of about 100× about 100 μm$^2$ (or any other suitable size area). The central canvas may be designated for electron-beam exposure.

In other aspects of the disclosure, the Ti/Au layer can vary in thickness, e.g., about 1, about 2, about 3, about 4, about 5, about 6, about 7, about 8, about 9, or about 10 nm Ti and/or about 15, about 16, about 17, about 18, about 19, about 20, about 21, about 22, about 23, about 24, or about 25 nm Au.

An electron beam lithography instrument (e.g., the Raith e-LiNE made by Raith GmBH of Dortmund, Germany) with the electron acceleration reduced to 100V may be used to evaluate the structure. In at least one embodiment, markers are patterned on the edge of the exemplary structure to aid in focus and alignment. The measured electron beam current $I_e$ is about 195 pA, and the write field is set to be about 100 μm×about 100 μm. The sample chamber vacuum is maintained at about 1×10$^{-6}$ mbar during ULV-EBL writing and electrical measurements. Because LAO/STO structures may be light-sensitive, optical illumination inside the chamber, which may be used to adjust the sample stage position and e-beam gun position, is turned off after the initial setup and the structure then kept in no-light or low-light conditions during ULV-EBL writing. The conductance of the 2DEG devices is monitored in situ during the ULV-EBL writing process. After device patterning is complete, the sample heterostructure is transferred to a dilution refrigerator to allow electrical transport measurements to be performed over a temperature range of about 50 mK to about 300K (or any value in-between these two values) in magnetic fields up to about 9 T. C-AFM lithography may be performed using an AFP lithography device such as the Asylum Research MFP-3D AFM made by Oxford Instruments of Abingdon, UK in a contact mode.

Figure 2B:
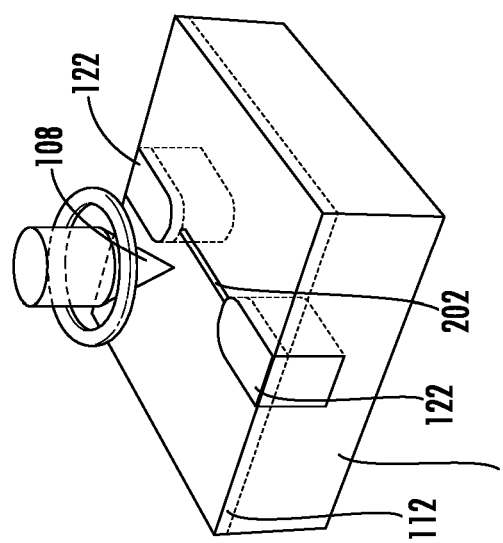
FIG. 2B illustrates a schematic of an electron beam and a $LaAlO_3/SrTiO_3$ heterostructure in accordance with one or more embodiments shown and described herein.
Figure 2C:
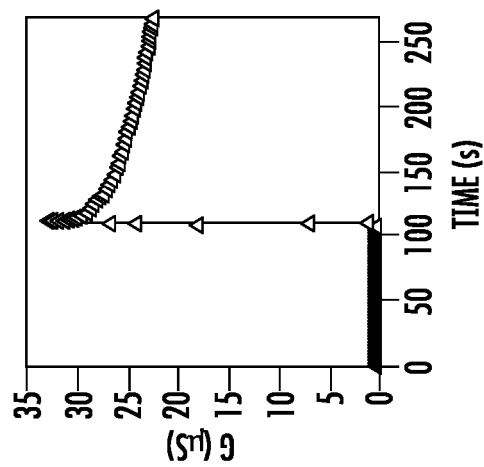
FIG. 2C illustrates a graph of a time trace of conductance in accordance with one or more embodiments shown and described herein.
Figure 2G:
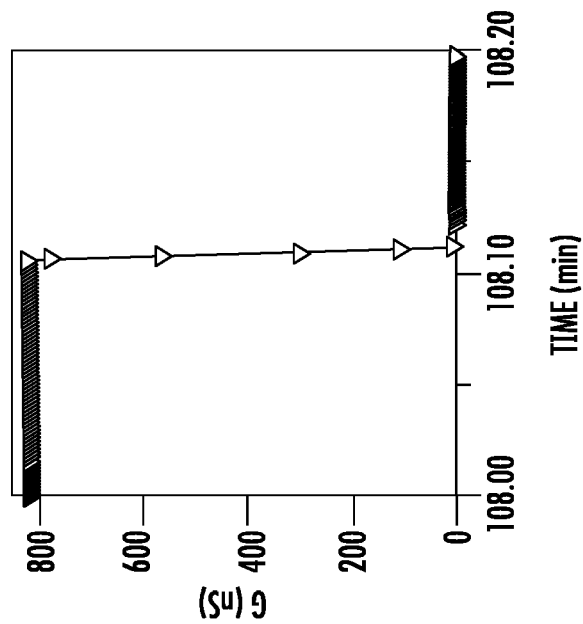
FIG. 2G illustrates atomic force microscopy (AFM) erasure of the ULV-EBL created nanowire with a negatively biased AFM tip in accordance with one or more embodiments shown and described herein.

FIG. 2B illustrates a schematic of an electron beam and a LaAlO$_3$/SrTiO$_3$ heterostructure. The electron beam 108 directed to the surface 110 of the first insulating layer 112 (e.g., LaAlO$_3$ layer) may switch the interface 120 to a conductive state. A wire 202 (e.g., conducting line, conducting channel) may be written onto the heterostructure. FIG. 2C illustrates a graph of a time trace of conductance. As appreciated from FIG. 2C, prior to the wire 202 being written onto the heterostructure, the conductance is zero. After the wire 202 is written onto the heterostructure, the conductance increases to a value between 30 µS and 35 µS, and then decays to stabilize at a non-zero value between about 20 µS and about 25 µS (e.g., about 20, about 21, about 22, about 23, about 24, or about 25 µS).

FIG. 2D illustrates a schematic of the reconfigurable device 130 and low-voltage electron beam. The reconfigurable device 130 is configured to undergo writing by ULV-EBL writing techniques and/or erasing by c-AFM erasing techniques as set forth herein. The reconfigurable device 130 includes first insulating layer 112 (e.g., LaAlO$_3$ layer), the second insulating layer 114 (e.g., SrTiO$_3$ layer) and the wire 202. The electron beam 108 may be directed to the first insulating layer 112. The reconfigurable device 130 is disposed on a substrate (e.g., a silicon substrate). For example, the LAO/STO membrane may be disposed on silicon.

In some embodiments, the second insulating layer 114 may be thicker than the first insulating layer 112. For example, a thin LaAlO$_3$ layer may be disposed on a thicker SrTiO$_3$ layer. The first insulating layer 112 may be thicker than the second insulating layer 114. For example, a thick SrTiO$_3$ layer (e.g., about 0.1, about 0.2, about 0.3, about 0.4, about 0.5 mm etc.) may be disposed on a thinner LaAlO$_3$ layer (e.g., about 1, about 1.1, about 1.2 nm, about 1.3, about 1.4, about 1.5 nm, etc.).

FIG. 2E illustrates a two-dimensional electron gas (2DEG) nanowire configuration. The nanowire configuration may include a strip-like pattern of dots (e.g., dwell points 210) with a total width, w=50 nm. The strip-like pattern of dots may be exposed between two electrodes using ULV-EBL as illustrated in FIGS. 2D and 2E. The average electron dose may be defined as $D_r=(I_e\tau)/dsdl$, where $I_e$ is the beam current, t is the dwell time, and ds=dl=about 10 nm are the step size and line spacing, respectively. The dose used to expose the channel may be about $D_r$=195 µC/cm$^2$ (or any other suitable value, such as about 150, about 155, about 160, about 165, about 170, about 175, about 180, about 185, about 190, about 195, about 200, about 205, about 210, about 215, about 220, about 225 µC/cm$^2$). The dwell points 210 may have a spacing of about 10 nm (or for example about 5, about 6, about 7, about 8, about 9, about 10, about 11, about 12, about 13, about 14, about 15, about 16, about 17, about 18, about 20 nm, or any value in-between these numbers, etc.), although the spacing between dwell points may be at regular intervals or irregular intervals according to various embodiments.

Figure 2F:
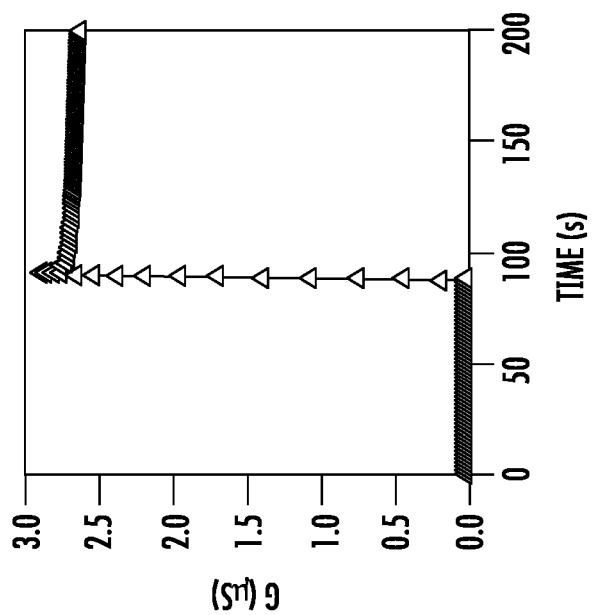
FIG. 2F illustrates conductance associated with the connection of two interfacial electrodes by writing a nanowire with a 100 V electron-beam (e-beam) in accordance with one or more embodiments shown and described herein.

FIG. 2F illustrates conductance from connecting two interfacial electrodes by writing a nanowire with a 100 V electron-beam (e-beam). FIG. 2F illustrates a conductance rise, with an on/off ratio of about 153.7 that is dominated by the "off" value, which may be a function of the particular characteristics of the sample heterostructure. The heterostructure may be transferred into an AFM, and may be kept in gel (e.g., in a gel container) under ambient atmospheric conditions, for example.

FIG. 2E illustrates atomic force microscopy (AFM) erasure of the ULV-EBL created nanowire with a negatively biased AFM tip. FIG. 2E illustrates the "cut" from the negatively biased AFM tip from which the conducting channel is insulated. The ability of c-AFM lithography to locally erase the nanostructure indicates that the writing process is reversible. The conductivity may be controlled in a similar manner as c-AFM-based methods.

FIG. 3A illustrates a schematic of a LaAlO$_3$/SrTiO$_3$ heterostructure with wiring according to at least one embodiment. FIG. 3B illustrates a detailed schematic of the LaAlO$_3$/SrTiO$_3$ heterostructure of FIG. 3A. A first wire 202A may be separated from a second wire 202B by a separation distance, d. For example, an end of the first wire 202A may be separated from an end of the second wire 202B by the separation distance d. FIG. 3C illustrates the conductance as a function of the separation distance d. The graph shows the approximate resolution of the electron beam 108. At a separation distance of greater than about 10 nm, there is essentially no conductance between the wires 202. At a separation distance of less than about 10 nm, there is a conducting path between the wires 202. In this example, the graph shows that the electron beam 108 creates features on the order of tens of nanometers.

Figures 3D, 3E, 3F:
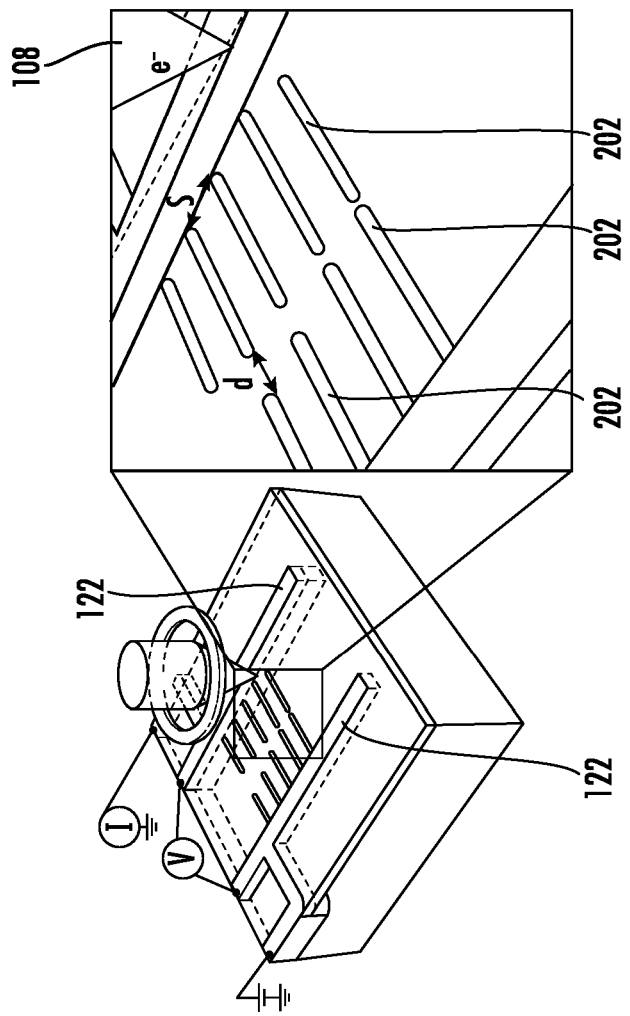
FIG. 3D illustrates a schematic of nanowire writing with varying gaps in accordance with one or more embodiments shown and described herein.
FIG. 3E illustrates a schematic of the nanowires of FIG. 3D in accordance with one or more embodiments shown and described herein.
FIG. 3F illustrates a graph of conductance as a function of separation distance in accordance with one or more embodiments shown and described herein.

FIG. 3D illustrates a schematic of writing nanowires with varying gaps according to at least one embodiment. FIG. 3E illustrates a detailed schematic of the nanowires of FIG. 3D. The nanowires are separated from each other by a distance S, e.g., where S is about 5 µm (or any other suitable value, such as about 1, about 2, about 3, about 4, about 5, about 6, about 7, about 8, about 9, or about 10 µm). The nanowires may have a gap of length d (e.g., separation distance, gap size).

FIG. 3F illustrates a graph of conductance as a function of separation distance. Significant changes in conductance ΔG may appear when the gap size is in the range of about 5 to about 20 nm, or any value in-between these numbers, such as about 6, about 7, about 8, about 9, about 10, about 11, about 12, about 13, about 14, about 15, about 16, about 17, about 18, about 19, or about 20 nm). This may indicate that the gap starts to be covered by the writing resolution in this range. The resolution of the writing process may be about 10 nm, or any other value described herein. The resolution may vary based on the particular writing parameters and/or on variations between LAO/STO samples, for example.

Figure 3G:
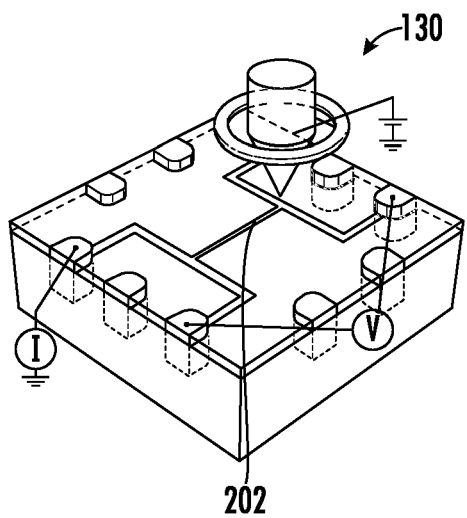
FIG. 3G illustrates a schematic of a reconfigurable device in accordance with one or more embodiments shown and described herein.
Figure 3H:
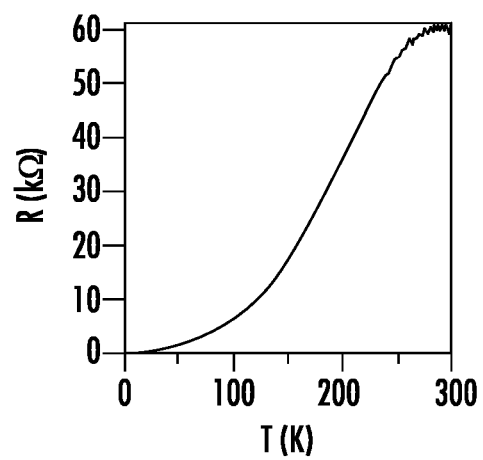
FIG. 3H illustrates a cooling curve in accordance with one or more embodiments shown and described herein.

FIG. 3G illustrates a schematic of the reconfigurable device 130. While room-temperature transport characteristics are relevant, the ability of devices to remain conductive at low temperatures is of particular salience for quantum device applications. Low-temperature transport properties of devices created by ULV-EBL are shown. FIG. 3G illustrates a four-terminal device (e.g., reconfigurable device 130). Transport measurements may be performed in a dilution refrigerator with a base temperature T of about 50 mK, for example. FIG. 3H illustrates a cooling curve R with respect to T. The conducting channel (e.g., wire 202, nanowire) may be present until the temperature T reaches about 50 mK. In other aspects, the temperature T may reach about 40, about 41, about 42, about 43, about 44, about 45, about 46, about 47, about 48, about 49, about 50, about 51, about 52, about 53, about 54, about 55, about 56, about 57, about 58, about 59, or about 50 mK. The nanowire may have a width w of about 2 nm. In other aspects, the nanowire may have a width w of about 1, about 1.1, about 1.2, about 1.3, about 1.4, about 1.5, about 1.6, about 1.7, about 1.8, about 1.9, about 2, about 2.1, about 3, about 4, about 5 nm, or any value in-between these numbers, such as about 3.2, about 4.1, about 4.8 nm, etc. In at least one embodiment, superconducting behavior is exhibited starting at about 200 mK. In other aspects, superconducting behavior is exhibited starting at about 190, about 195, about 200, about 205, or about 210 mK.

Figure 3I:
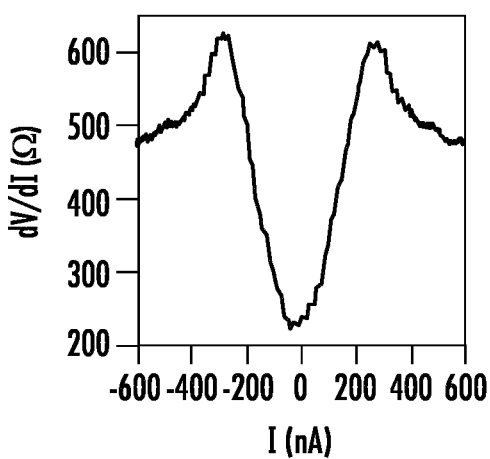
FIG. 3I illustrates current and voltage information in accordance with one or more embodiments shown and described herein.
Figure 3J:
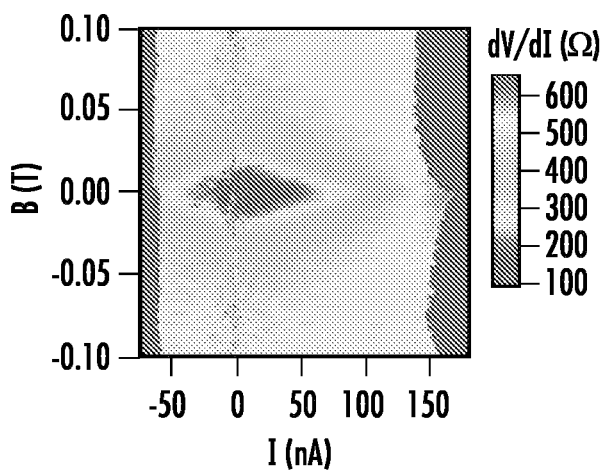
FIG. 3J illustrates current and voltage information plotted as a function of B and I in accordance with one or more embodiments shown and described herein.

FIG. 3I illustrates an IV measurement at T=50 mK showing a superconducting phase at B=0 T. FIG. 3J illustrates dV/dI plotted as a function of B and I. FIG. 3J illustrates an intensity map of difference conductance dV/dI vs. bias current/and magnetic field B, showing values for the critical current $I_c$=280 nA extracted from FIG. 3I and upper critical field $H_c$=82 mT.

Figure 4A:
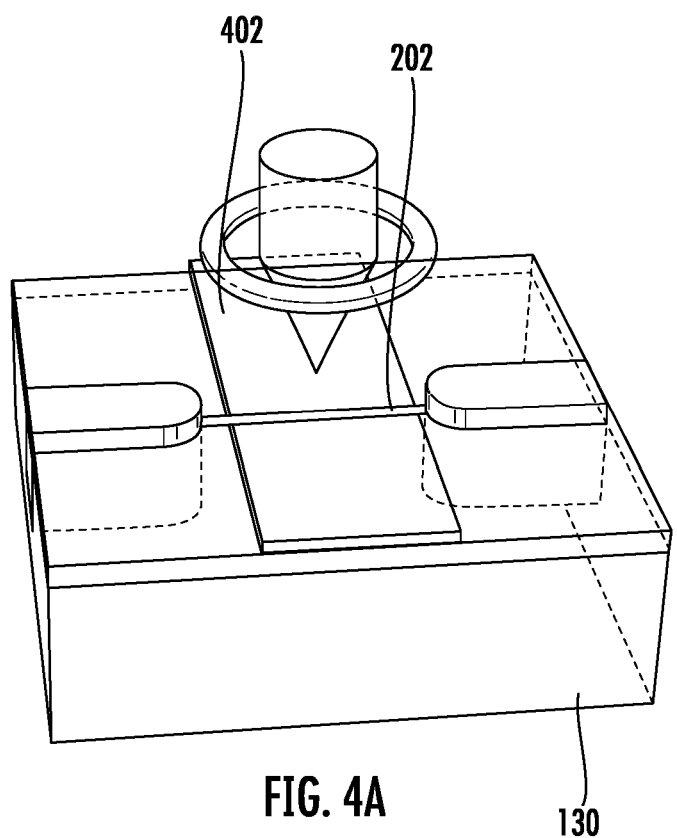
FIG. 4A illustrates a schematic of a $LaAlO_3/SrTiO_3$ heterostructure with an overlayer of graphene in accordance with one or more embodiments shown and described herein.

FIG. 4A illustrates a schematic of a $LaAlO_3/SrTiO_3$ heterostructure with an overlayer 402. The overlayer 402 may include graphene. In some embodiments, the overlayer 402 is not limited to graphene, however. For example, the overlayer 402 may include a two dimensional (2D) material such as hexagonal boron nitride (hBN), $NbSe_2$, $TaS_2$, and $MoS_2$. The overlayer 402 may include van der Waals materials that may be readily exfoliated. Van der Waals materials may include materials with in-plane covalent bonding and interlayer interactions, for example. The overlayer 402 may include a transition metal dichalcogenide monolayer. The overlayer 402 may include a monochalcogenide monolayer (e.g., a group IV monochalcogenide, phosphorene, a gallium monochalcogenide, an indium monochalcogenide, etc.). The overlayer 402 may include an ultrathin (e.g., less than or equal to about 100 nm, about 95, about 90, about 85, about 80, or about 75 nm, or any other suitable value) layer. The $LaAlO_3/SrTiO_3$ heterostructure may include one or more overlayers 402 disposed on the first insulating layer 112.

Further, the reconfigurable device 130 may include an overlayer 402 disposed on the first insulating layer 112. For example, the reconfigurable device 130 may include the overlayer 402 disposed on a $LaAlO_3$ layer. The overlayer 402 may include a van der Waals material. A conductive path may be written underneath the overlayer 402. A conductive path may be written underneath a van der Waals layer. The van der Waals layer may include graphene, boron nitride, or tungsten ditelluride. The overlayer 402 may be composed of graphene. For example, the overlayer 402 may include bilayer graphene. The electron beam 108 may write through the overlayer 402 disposed on the first insulating layer 112. The electron beam 108 may write through graphene. For example, the electron beam 108 may penetrate through the graphene and modify the electronic properties of the interface 120. The electron beam 108 may write through the overlayer 402 without damaging the overlayer 402. The reconfigurable device 130 may include one or more overlayers 402 disposed on the first insulating layer 112. The overlayer 402 may include a bilayer. The bilayer may include a moiré pattern. The moiré pattern may have a periodicity of 10 nm at 1.1 degrees. The second insulating layer 114 may be thicker than the overlayer 402. The reconfigurable device 130 may include the overlayer 402, the first insulating layer 112, and the second insulating layer 114. The first insulating layer 112 may be thicker than the second insulating layer 114. For example, a thick $SrTiO_3$ layer may be disposed on a thinner $LaAlO_3$ layer. The overlayer 402 may be disposed on the thick $SrTiO_3$ layer.

Figures 4B, 4C:
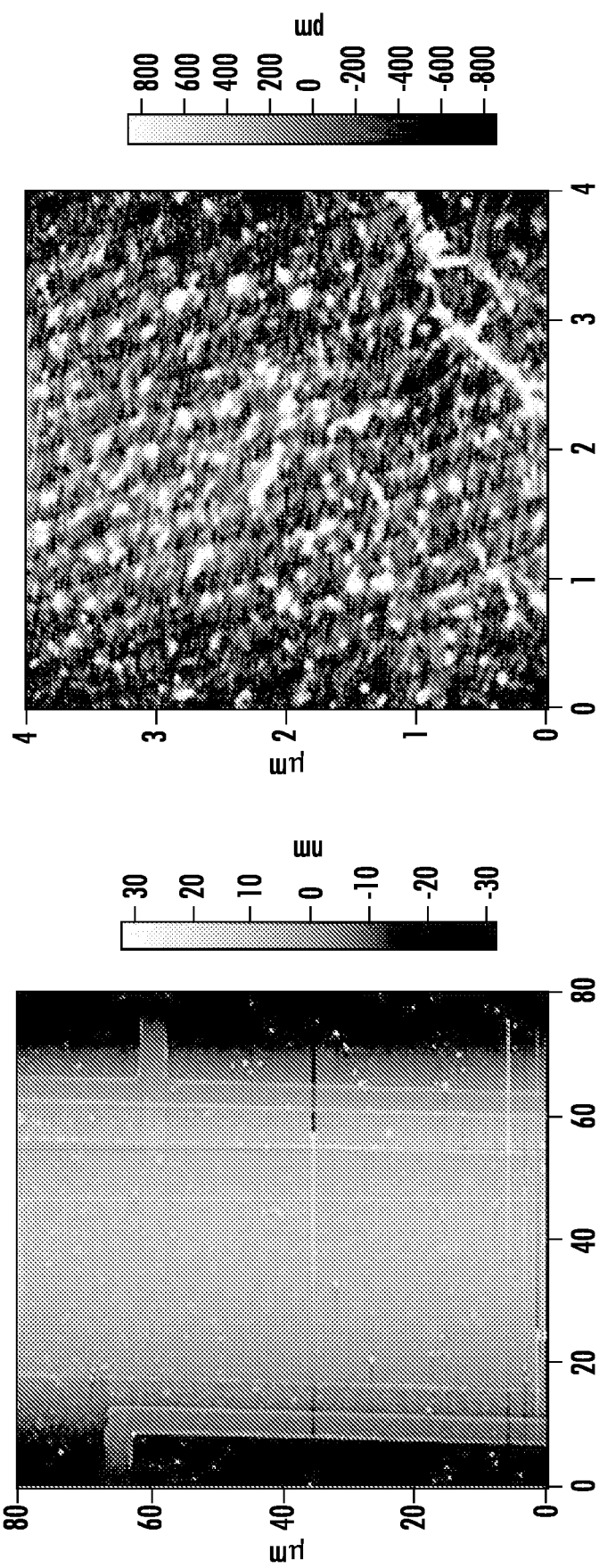
FIG. 4B illustrates a schematic of a $LaAlO_3/SrTiO_3$ heterostructure with an overlayer of graphene in accordance with one or more embodiments shown and described herein.
FIG. 4C illustrates the topography of graphene and a $LaAlO_3/SrTiO_3$ heterostructure in accordance with one or more embodiments shown and described herein.
Figure 4E:
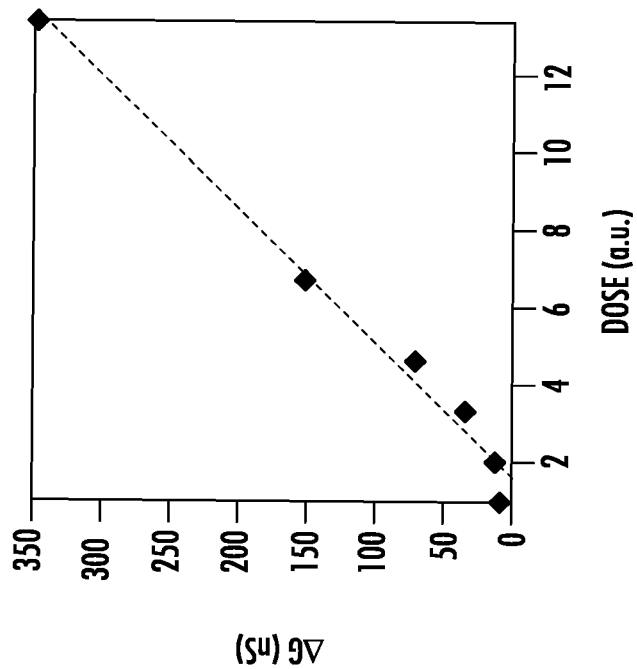
FIG. 4E illustrates a graph of conductance as a function of dosage in accordance with one or more embodiments shown and described herein.
Figure 4D:
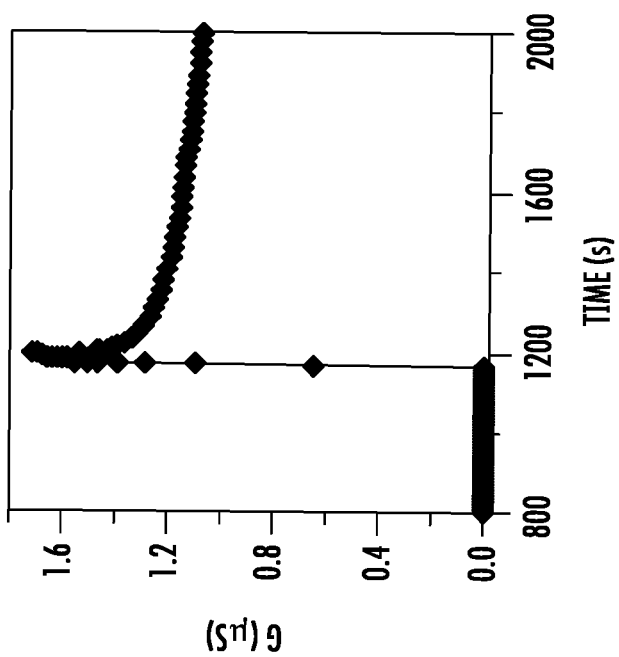
FIG. 4D illustrates a graph of a time trace of conductance in accordance with one or more embodiments shown and described herein.

FIG. 4B illustrates a schematic of a $LaAlO_3/SrTiO_3$ heterostructure with an overlayer of graphene. FIG. 4C illustrates the topography of graphene and a $LaAlO_3/SrTiO_3$ heterostructure. FIG. 4D illustrates a graph of a time trace of the conductance. The graph shows that prior to a wire 202 being written onto the heterostructure, the conductance is zero. After the wire 202 is written onto the heterostructure, the conductance increases to a value between about 1.4 µS and about 1.8 µS, and then decays to stabilize at a non-zero value between about 1 µS and about 1.2 µS. FIG. 4E illustrates a graph of the conductance as a function of dose (dosage) of electrons. The graph shows that the width of the wire 202 varies with the dose.

Figure 4H:
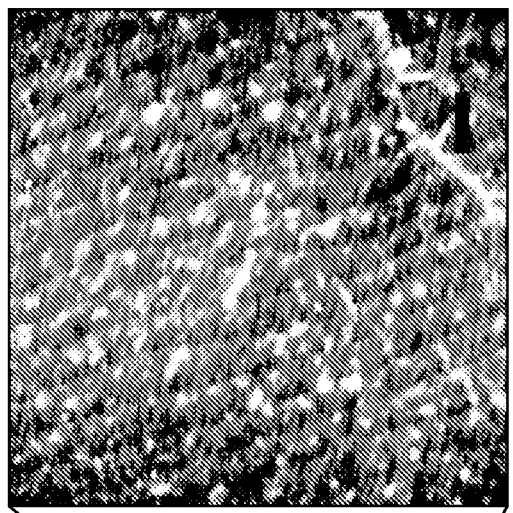
FIG. 4H illustrates an AFM image of graphene on LAO/STO in accordance with one or more embodiments shown and described herein.
Figure 4G:
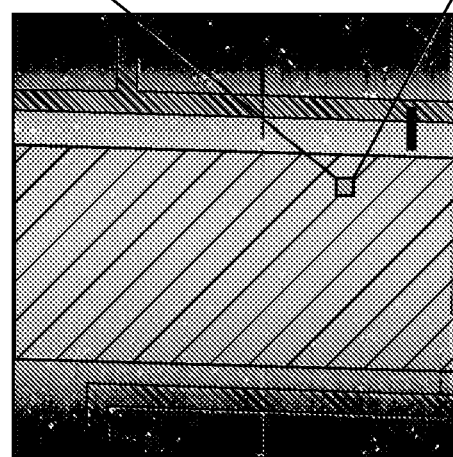
FIG. 4G illustrates an AFM profile of graphene on LAO/STO in accordance with one or more embodiments shown and described herein.
Figure 4F:
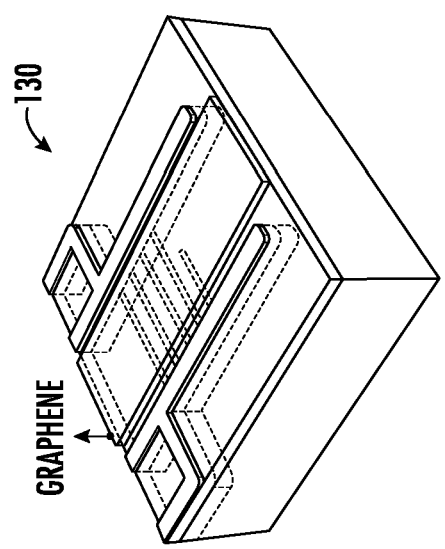
FIG. 4F illustrates a schematic of a reconfigurable device on graphene/LAO/STO in accordance with one or more embodiments shown and described herein.

FIG. 4F illustrates a schematic of the reconfigurable device 130 on graphene/LAO/STO according to an exemplary embodiment. According to an example, graphene (which is grown by chemical vapor deposition) is transferred onto LAO/STO and patterned into a rectangular shape. The graphene is then electrically isolated from the LAO/STO interface electrodes. FIG. 4G illustrates an AFM profile of graphene on LAO/STO. FIG. 4H illustrates an AFM image of graphene on LAO/STO. The graphene is conformal with respect to the STO surface.

Figure 4K:
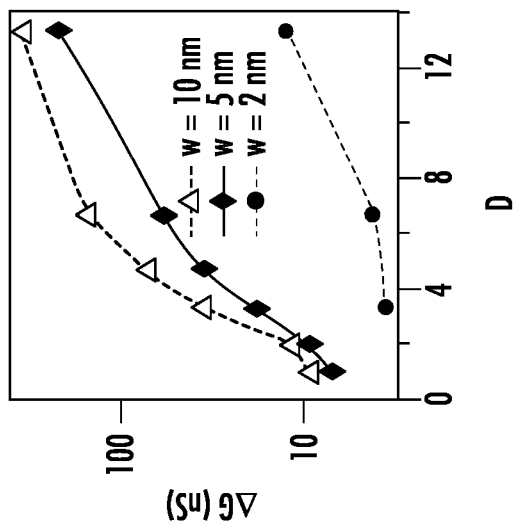
FIG. 4K illustrates a conductance change ΔG with respect to normalized dimensionless dose factor D for different widths of wires in accordance with one or more embodiments shown and described herein.
Figure 4J:
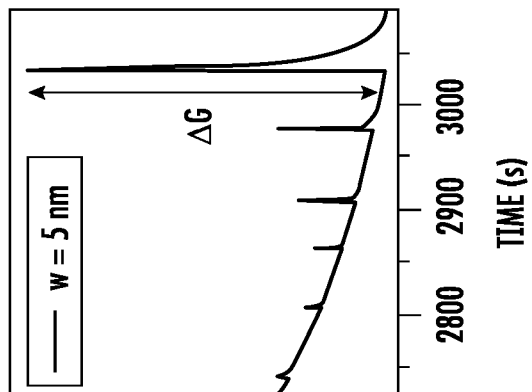
FIG. 4J illustrates a conductance change while writing a series of 5-nm-wide wires with increasing dose factors in accordance with one or more embodiments shown and described herein.
Figure 4I:
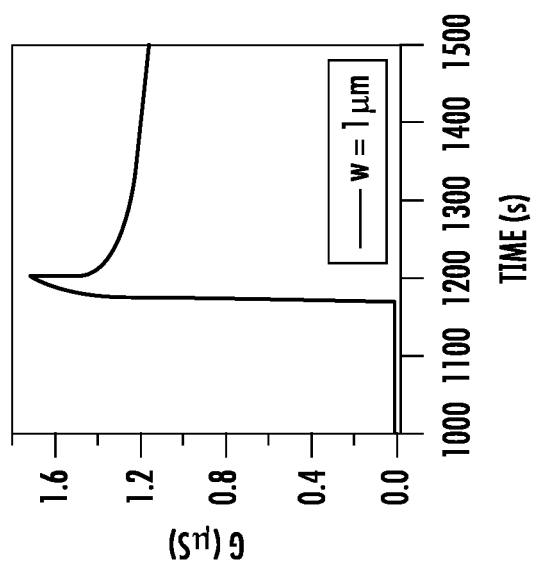
FIG. 4I illustrates a conductance change when writing a 1-μm-wide strip connecting two interface electrodes in accordance with one or more embodiments shown and described herein.

Following patterning, a conductive channel with a width w of about 1 µm is exposed, causing a substantial conductance rise as shown in FIG. 4I. During ULV-EBL writing, the total conductance increases and then abruptly decays after the electron beam is turned off, yielding a peak feature at a time t of about 1200 s. The conductance of the channel as a function of both electron dose and nanowire width may be evaluated. A dose of $D_0$=about 975 µC/cm² (or in other aspects, a dose $D_0$=about 900, about 925, about 950, about 975, about 1000, about 1025, or about 1050 µC/cm²) where D is defined as a dimensionless normalized dose factor, may be selected with a real area dose ($D_r=D_0D$) of the e-beam being varied. In particular, the dose may be varied while writing a series of wires (with a nanowire width of about 5 nm or any other width described herein) connected to the leads, with spacing of about 5 µm to minimize interactions. Spacing may also be for example, about 1, about 2, about 3, about 4, about 5, about 6, about 7, about 8, about 9, about 10 µm, or any value in-between these numbers. The conductance change ΔG may increase with the electron dose as shown in FIG. 4J. The conductance change ΔG relative to the normalized dose factor D for wires with different widths is shown in FIG. 4K.

Reversible doping of the LAO/STO interface via ULV-EBL may be carried out according to the exemplary embodiments herein. Oxygen vacancies, either in the STO or LAO layer, may shift the STO conduction band with respect to the Fermi energy. According to statistical quantum Monte Carlo simulations (which may be carried out using the CASINO software developed at Cambridge University, Cambridge, UK), electrons may be stopped before reaching the STO layer. Because of the low energy of the electron beam, direct e-beam-induced creation of oxygen vacancies in STO may be excluded. Electron-stimulated desorption of ions may be used to reverse doping. In at least one embodiment, the LAO surface may be covered by at least one monolayer of water, which remains present even under high vacuum conditions. In the case of graphene/LAO/STO, various mechanisms are possible. Electron beam irradiation of boron nitride/graphene heterostructures may be used to dope the graphene layer reversibly, depending on the voltage applied across a $SiO_2$ barrier and/or to reversible gating of the graphene/LAO/STO interface. With c-AFM lithography, it is understood that protons penetrate the graphene layer, and that a reversible conductance change may be regulated at least in part by interfacial liquid layers and/or oxygen vacancies.

The aforementioned techniques are contemplated to permit rapid creation of large-scale complex nanostructures at oxide interface layers and/or through two-dimensional layers. In particular, the systems and methods of the present disclosure may be extended to heterostructures between LAO/STO and vdW materials other than single-layer graphene.

Figure 5:
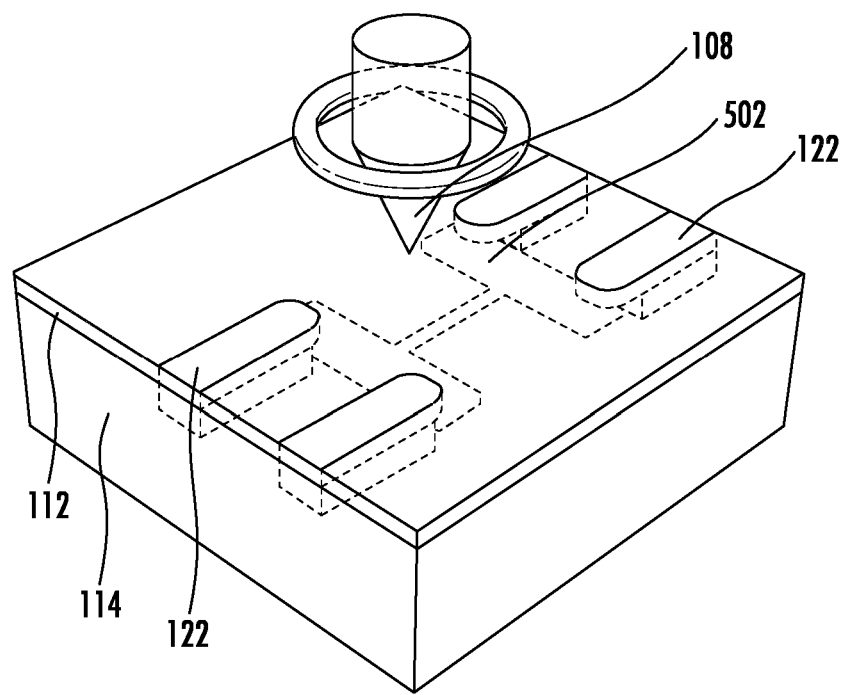
FIG. 5 illustrates a schematic of an electron beam and a $LaAlO_3/SrTiO_3$ heterostructure in accordance with one or more embodiments shown and described herein.

FIG. 5 illustrates a schematic of an electron beam and a LaAlO$_3$/SrTiO$_3$ heterostructure (e.g., electronic assembly). The heterostructure may include the first insulating layer 112 and the second insulating layer 114. In some embodiments, the electronic assembly includes one or more device electrodes (e.g., interface contacts 122). The electronic assembly includes one or more interface electrodes 502. The one or more interface electrodes 502 are configured to be coupled with the one or more device electrodes. The electronic assembly includes the first insulating layer 112 and the second insulating layer 114.

The electronic assembly includes an interface 120 between the first insulating layer 112 and the second insulating layer 114. The interface 120 is coupled with the one or more interface electrodes 502. The electronic assembly includes an overlayer 402 disposed on the first insulating layer 112. The electronic assembly is reconfigurable by directing an ultra-low voltage electron beam to the first insulating layer. In some embodiments, the electronic assembly includes an overlayer 402 including graphene. In some embodiments, the first insulating layer 112 includes SrTiO$_3$ and the second insulating layer 114 includes LaAlO$_3$. In some embodiments, the first insulating layer 112 includes LaAlO$_3$ and the second insulating layer 114 includes SrTiO$_3$.

Figure 6:
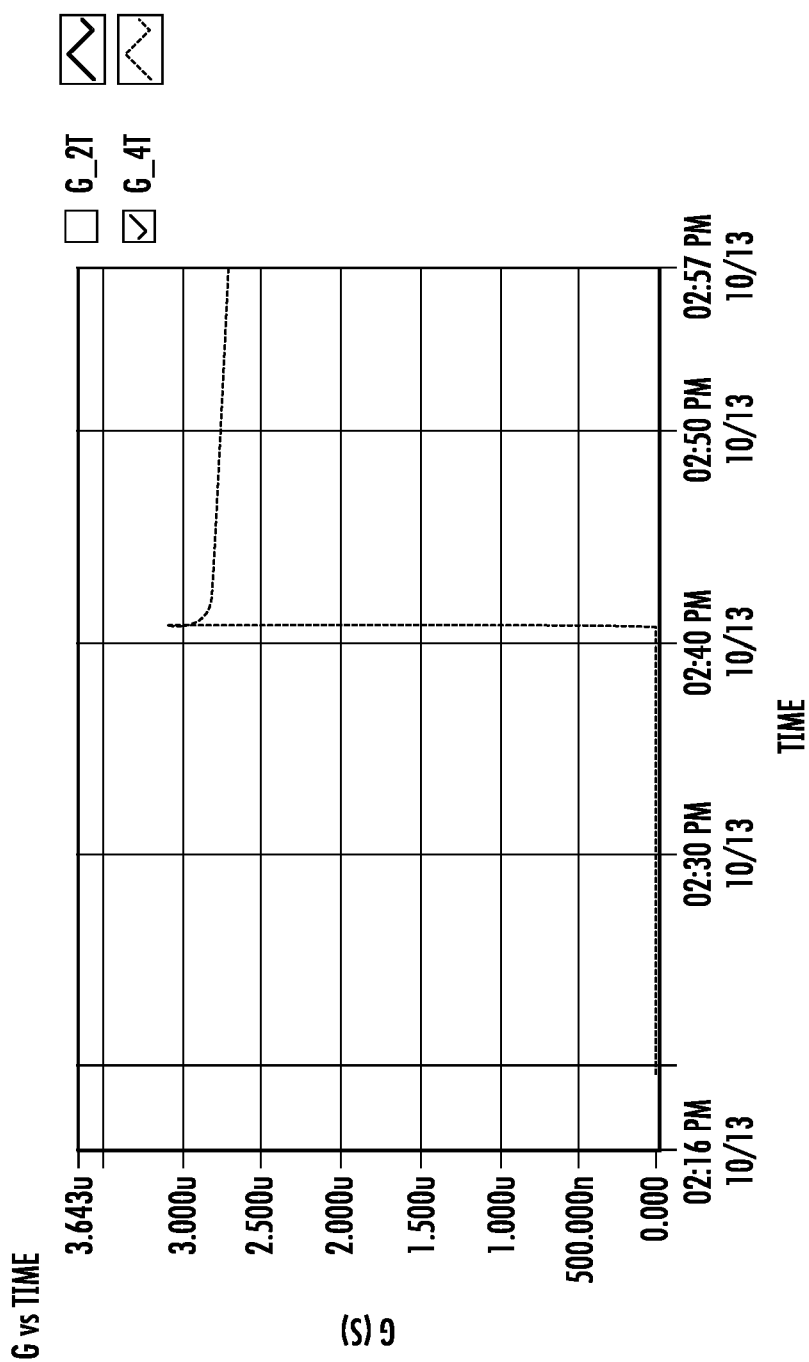
FIG. 6 illustrates a plot of conductance in accordance with one or more embodiments shown and described herein.

FIG. 6 illustrates a plot of conductance relative to time. Prior to the writing of the nanowire, the measured conductance (G) is about 0 Siemens(S). After the writing of the nanowire, the measured conductance is between about 2.5 µS and about 3.5 µS. The conductance may reach a steady state. The plot illustrates that the writing of the nanowire creates a conductive channel. In some embodiments, the write field is about 500 µm, the minimum step size is about 0.0078 µm, the beam current is about 0.4694 nA, the area step size is about 0.0234 µm, the area line spacing is about 0.0234 µm, the area dwell time is about 0.013998 ms, the area dose is about 120 µC/cm$^2$, and the beam speed is about 1.6716674 mm/s. The area dose corresponds to the ratio of the product of the beam current and dwell time to the product of the step size and line spacing (dose=(beam current×area dwell time)/(step size×line spacing)).

In other aspects of the disclosure, the write field can range from about 300, about 325, about 350, about 375, about 400, about 425, about 450, about 475, about 500, about 525, about 550, about 575, about 600, about 625, about 650, about 675, or about 700 µm, or any other suitable value in-between these numbers or described herein. In other aspects of the disclosure, the minimum step size is about 0.007, about 0.0071, about 0.0072, about 0.0073, about 0.0074, about 0.0075, about 0.0076, about 0.0077, about 0.0078, about 0.0079, about 0.008, about 0.0081, about 0.0082, about 0.0083, about 0.0084, about 0.0085, about 0.0086, about 0.0087, about 0.0088, about 0.0089, or about 0.009 µm, or any other suitable value in-between these numbers or described herein. In other aspects of the disclosure, the area line spacing is about 0.0230, about 0.0231, about 0.0232, about 0.0233, about 0.0234 µm, about 0.0235, about 0.0236, about 0.0237, about 0.0238, about 0.0239, about 0.0240 nm, or any other suitable value in-between these numbers or described herein. In other aspects of the disclosure, the area dwell time is about 0.011, about 0.012, about 0.13, about 0.013998, about 0.014, about 0.15 ms, or any other suitable value in-between these numbers or described herein. In other aspects of the disclosure, the area dose is about 70, about 75, about 80, about 85, about 90, about 95, about 100, about 105, about 110, about 115, about 120, about 125, about 130, about 135, about 140, about 145, or about 150 µC/cm$^2$, or any other suitable value in-between these numbers or described herein. Finally, in other aspects of the disclosure the beam speed is about 1.1, about 1.2, about 1.3, about 1.4, about 1.5, about 1.6, about 1.6716674, about 1.7, about 1.8, about 1.9, about 2 mm/s, or any other suitable value in-between these numbers or described herein.

FIG. 7A illustrates a schematic of a reconfigurable device on hBN/graphene/LAO/STO. Hexagonal boron nitride (hBN) may be disposed on the graphene (Gr) overlayer. The thickness of the hBN for the structure in FIG. 7A is about 25 nm. FIG. 7B illustrates a detailed schematic of the reconfigurable device of FIG. 7A. FIG. 7C illustrates a schematic of a reconfigurable device on hBN/graphene/LAO/STO. Hexagonal boron nitride (hBN) may be disposed on the graphene (Gr) overlayer. The thickness of the hBN for the structure in FIG. 7C is about 15 nm. FIG. 7D illustrates a detailed schematic of the reconfigurable device of FIG. 7C. FIG. 7E illustrates a schematic of a reconfigurable device on hBN/graphene/LAO/STO. Hexagonal boron nitride (hBN) may be disposed on the graphene (Gr) overlayer. The thickness of the hBN for the structure in FIG. 7E is about 20 nm. FIG. 7F illustrates a detailed schematic of the reconfigurable device of FIG. 7E. FIG. 7G illustrates a schematic of a reconfigurable device on hBN/graphene/LAO/STO. Hexagonal boron nitride (hBN) may be disposed on the graphene (Gr) overlayer. The thickness of the hBN for the structure in FIG. 7G is about 15 nm. FIG. 7H illustrates a detailed schematic of the reconfigurable device of FIG. 7G. In one or more embodiments, the thickness of the hBN may be in the range of about 10 nm to about 30 nm (e.g., about 10, about 11, about 12, about 13, about 14, about 15, about 16, about 17, about 18, about 19, about 20, about 21, about 22, about 23, about 24, about 25, about 26, about 27, about 28, about 29, or about 30 nm, or any other suitable value in-between these numbers or described herein, etc.). In some embodiments, the graphene overlayer may be disposed on the LaAlO$_3$ layer, and the LaAlO$_3$ layer may in turn be disposed on the SrTiO$_3$ layer. A nanowire may then be written through the hBN encapsulated graphene area.

Figure 8:
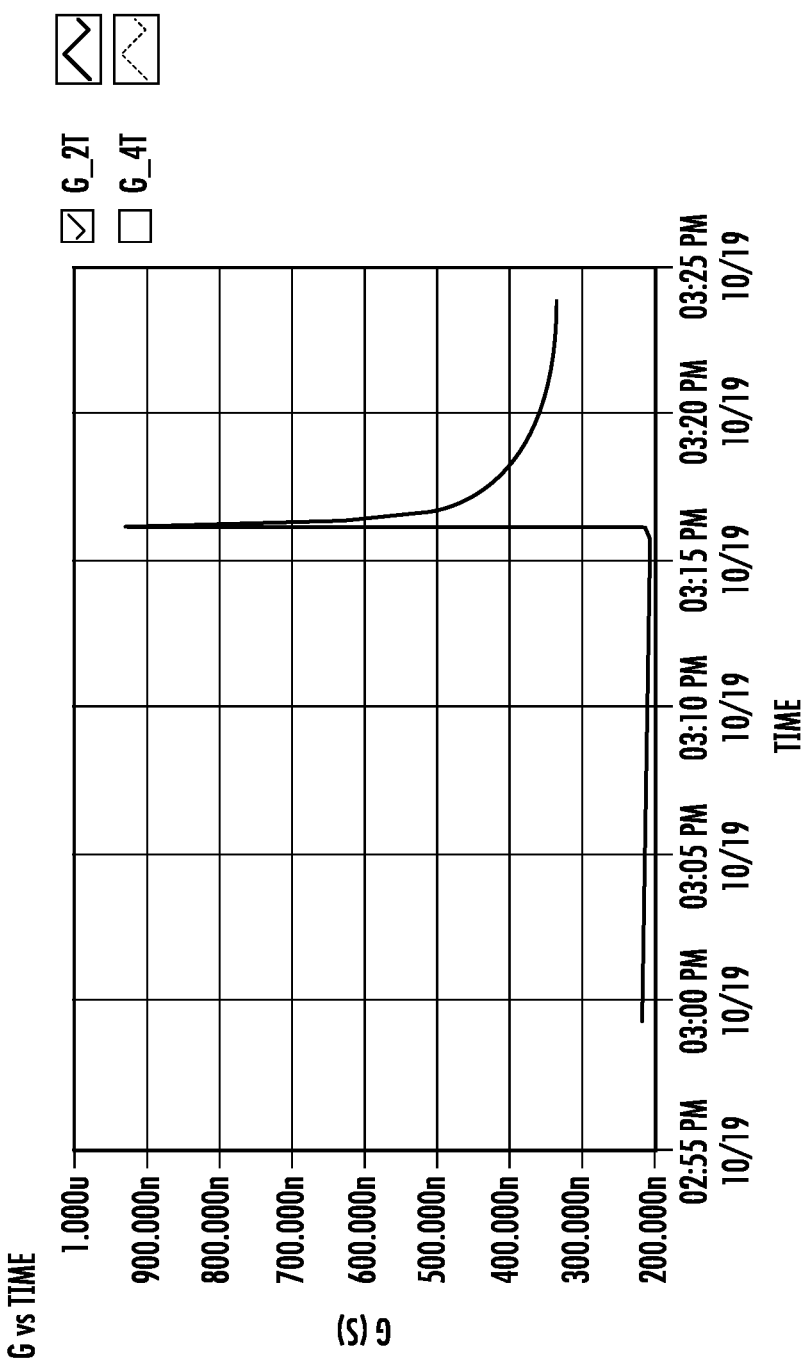
FIG. 8 illustrates a plot of conductance in accordance with one or more embodiments shown and described herein.

FIG. 8 illustrates a plot of conductance relative to time. Prior to the writing of the nanowire, the measured conductance (G) is 0 about Siemens(S). After the writing of the nanowire, the measured conductance is between about 300 nS and about 1 µS. The conductance may attain a steady state. The plot illustrates that the writing of the nanowire creates a conductive channel. The nanowire may be written through the hBN encapsulated graphene area shown in FIGS. 7A-7H. In some embodiments, the write field is about 500 µm, the minimum step size is about 0.0078 µm, the beam current is about 0.025068 nA, the area step size is about 0.0234 µm, the area line spacing is about 0.0234 µm, the area dwell time is about 0.010921 ms, the area dose is about 50 µC/cm$^2$ and the beam speed is about 2.1426609 mm/s. The area dose may be equal to (beam current×area dwell time)/(step size×line spacing). The system may include write field alignment and three-point alignment.

Figure 9:
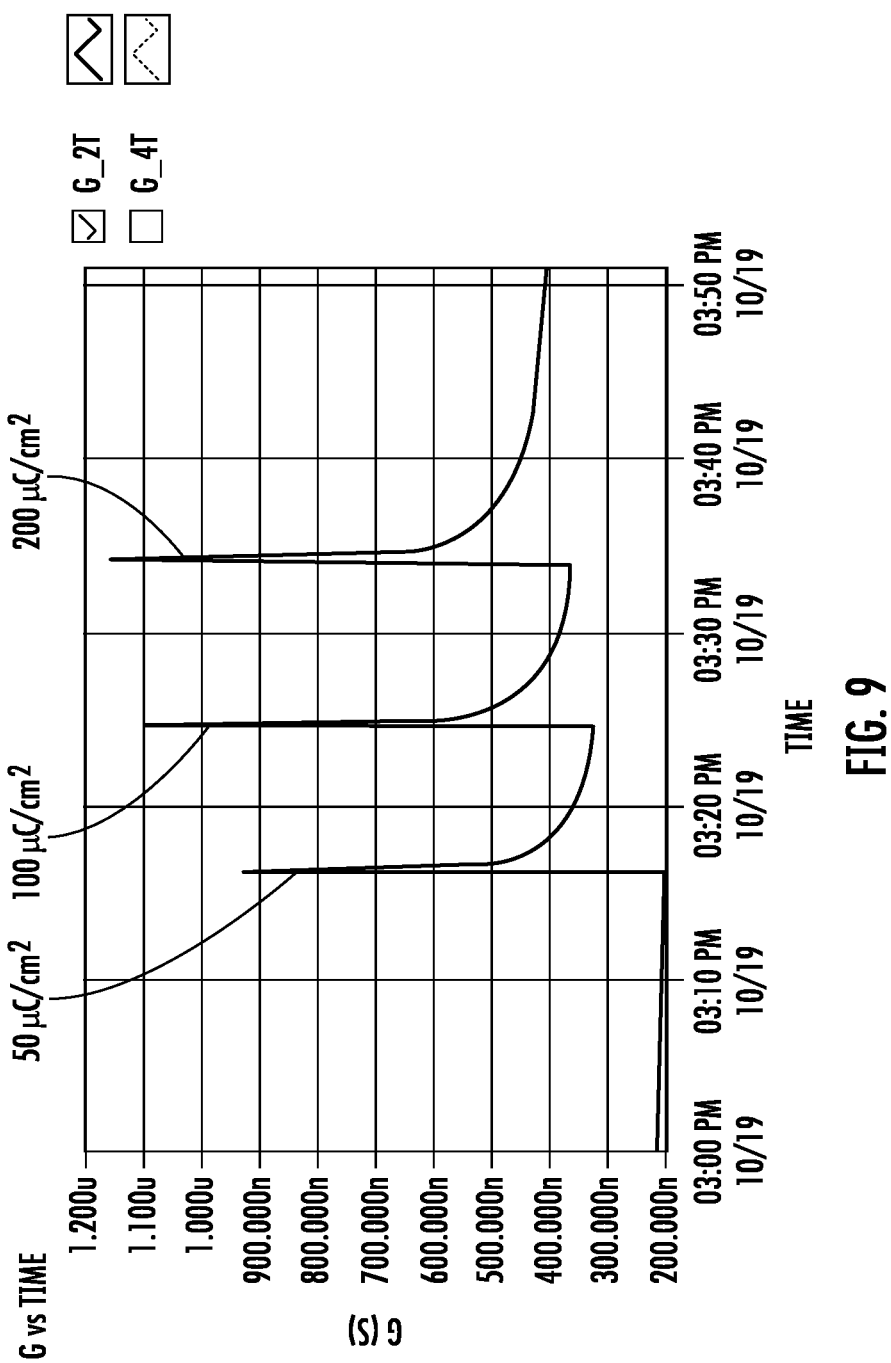
FIG. 9 illustrates a plot of conductance with different doses in accordance with one or more embodiments shown and described herein.

FIG. 9 illustrates a plot of conductance relative to time with different doses. Prior to the writing of the nanowire, the measured conductance (G) is about 0 Siemens(S). Similar to FIG. 8 discussed above, after the writing of the nanowire, the measured conductance may be about between about 300 nS and about 1.2 µS. The conductance may attain a steady state. The plot illustrates that the writing of the nanowire creates a conductive channel. The nanowire may be written through the hBN encapsulated graphene area shown in FIGS. 7A-7H. The area doses may include, for example, doses of about 50 µC/cm² about 100 µC/cm² and about 200 µC/cm².

Electronic Property Control Techniques

Figure 10:
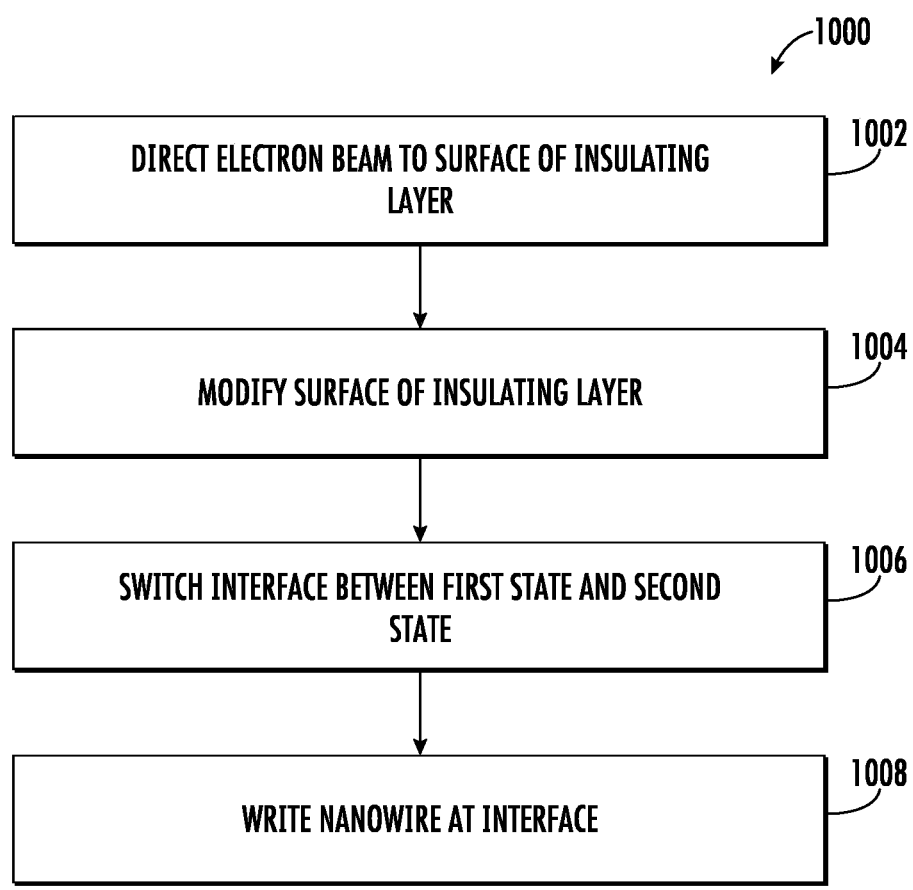
FIG. 10 illustrates a flow chart of an example method for configuring the electronic properties of two-dimensional complex-oxide interfaces in accordance with one or more embodiments shown and described herein.

FIG. 10 illustrates a flow chart of an example method 1000 for configuring (e.g., programming) the electronic properties of two-dimensional (2D) complex-oxide interfaces. In brief overview, the method 1000 may include directing an electron beam to a surface of an insulating layer (step 1002). The method 1000 may include modifying the surface of the first insulating layer (step 1004). The method 1000 may include switching the interface between a first state and a second state (step 1006). The method 1000 may include writing a nanowire at the interface (step 1008).

In further detail, the method 1000 may include directing an electron beam to a surface of an insulating layer (step 1002). Directing an electron beam to a surface of an insulating layer may include directing an ultra-low voltage electron beam to a surface of a first insulating layer. The first insulating layer may be disposed on a second insulating layer. The first insulating layer may include $SrTiO_3$ and the second insulating layer may include $LaAlO_3$. Directing the electron beam may be part of an ultra-low voltage electron beam lithography technique. The ultra-low voltage electron beam lithography technique may be performed under vacuum conditions, which may extend the lifetime of the written patterns.

The method 1000 may include modifying the surface of the first insulating layer (step 1004). Modifying the surface of the first insulating layer may include modifying, by the application of the ultra-low voltage electron beam, the surface of the first insulating layer to selectively switch an interface between a first state having a first electronic property and a second state having a second electronic property. In some embodiments, the first state is an insulating state and the second state is a conductive state. In some embodiments, the first state is a first conductive state and the second state is a second conductive state. The second conductive state may have higher conductance that the first conductive state. In at least one embodiment, the conductive state may be reversible via prolonged exposure to air due to natural decay.

Modifying the surface of the first insulating layer may include modifying a portion of the surface of the first insulating layer. The portion of the surface of the first insulating layer may have a feature size of greater than or equal to about 2 nanometers and less than or equal to about 200 nanometers. For example, in some embodiments, the portion may have a feature size of greater than or equal to about 3 nanometers and less than about 4 nanometers. In some embodiments, the feature size may be smaller than about 2 nanometers, for example, about 1.2 nanometers. In other aspects of the disclosure, the portion of the surface of the first insulating layer may have a feature size of greater than or equal to about 2, about 3, about 4, about 5, about 6, about 7, about 8, about 9, about 10, about 11, about 12, about 13, about 14, about 15, about 16, about 17, about 18, about 19, about 20, about 21, about 22, about 23, about 24 or about 25 nanometers, or any amount in-between these values, such as about 1.2 nm, about 1.5 nm, about 1.75 nm, etc. In other aspects of the disclosure, the portion of the surface of the first insulating layer may have a feature size of less than or equal to about 200, about 195, about 190, about 185, about 180, about 175, about 170, about 165, about 160, about 155, or about 150 nanometers, or any amount in-between these values, such as about 195.2 nm, about 195.5 nm, about 195.75 nm, etc.

Modifying the surface of the first insulating layer includes switching a portion of the interface to realize at least of an insulating state, a conducting state, a superconducting state, a ferroelectric state, and a ferromagnetic state. For example, the electron beam may modify the surface of the first insulating layer to change the electronic properties of the interface.

The method 1000 may include switching the interface between a first state and a second state (step 1006). For example, switching the interface between a first state and a second state may include switching the interface between an insulating state and a conductive state. Switching the interface between a first state and a second state may include switching the interface between an insulating state and a conductive state. Switching the interface between a first state and a second state may include switching the interface between a first conductive state and a second conductive state.

The method 1000 may include writing a nanowire (e.g., conductive line, nanoscale feature, pattern etc.) at the interface (step 1008). Writing a nanowire may include writing a conductive line at the interface at a speed of greater than or equal to about 0.1 mm/sec and less than or equal to about 15 mm/sec, greater than or equal to about 1 mm/sec and less than or equal to about 15 mm/sec, greater than or equal to about 2 mm/sec and less than or equal to about 15 mm/sec, greater than or equal to about 3 mm/sec and less than or equal to about 15 mm/sec, greater than or equal to about 4 mm/sec and less than or equal to about 15 mm/sec, or greater than or equal to about 5 mm/sec and less than or equal to about 15 mm/sec. For example, the method may include writing a nanoscale feature at a speed of about 10 mm/sec. In some embodiments, writing the nanoscale feature may occur at a speed of greater than 15 mm/sec. For example, writing the nanoscale feature may occur at a speed of about 20 mm/sec. Writing a nanowire may include writing a nanowire at the interface. Writing a nanoscale feature may include erasing a nanoscale feature. Erasure of conductive lines may indicate that the writing process (e.g., writing technique) is reversible (e.g., reconfigurable).

In other aspects of the disclosure, writing a nanowire may include writing a conductive line at the interface at a speed of greater than or equal to about 0.1, about 0.2, about 0.3, about 0.4, about 0.5, about 0.6, about 0.7, about 0.8, about 0.9, about 1, about 2, about 3, about 4, about 5, about 6, about 7, about 8, about 9, about 10, about 11, about 12, about 13, about 14, about 15, mm/sec, or any suitable value in-between these number, such as about 2.5, about 3.5, about 4.5 mm/sec, etc. In other aspects of the disclosure, writing a nanowire may include writing a conductive line at the interface at a speed greater than any value described herein and less than or equal to about 25, about 24, about 23, about 22, about 21, about 20, about 19, about 18, about 17, about 16, or about 15 mm/sec, or any suitable value in-between these number, such as about 20.5, about 23.5, about 24.5 mm/sec, etc.

The writing technique in at least one embodiment may be substantially non-destructive in that the atomic arrangement of the overlayer and/or first insulating layer are substantially preserved. The method may include creating reconfigurable nanoscale electrodes below an overlayer. For example, the method may include creating reconfigurable nanoscale electrodes directly below layers of 2D materials (e.g., hexagonal boron nitride, graphene, hexagonal boron nitride heterostructures, etc.).

In at least one embodiment, the method may include forming a pattern with a periodic structure. For example, the pattern may include a hexagonal pattern. The pattern may include topologically protected channels. The pattern may include a hexagonal structure, such as a honeycomb pattern with a spacing of about 10 nm. The pattern may be a non-periodic pattern, a quasiperiodic pattern, or a rotationally symmetric pattern, for example, and is not limited to a periodic structure governed by interatomic spacing. For example, the pattern may have 2-fold symmetry, 3-fold symmetry, 4-fold symmetry, 5-fold symmetry, 6-fold symmetry, or 8-fold symmetry. In other aspects of the disclosure, the honeycomb spacing may be for example about 5, about 6, about 7, about 8, about 9, about 10, about 11, about 12, about 13, about 14, about 15 nm, or any suitable value in-between these numbers.

Referring once more to the method 1000, the method may further include directing the ultra-low voltage electron beam through an overlayer disposed on the first insulating layer. The overlayer may include but is not limited to graphene.

Figure 11A:
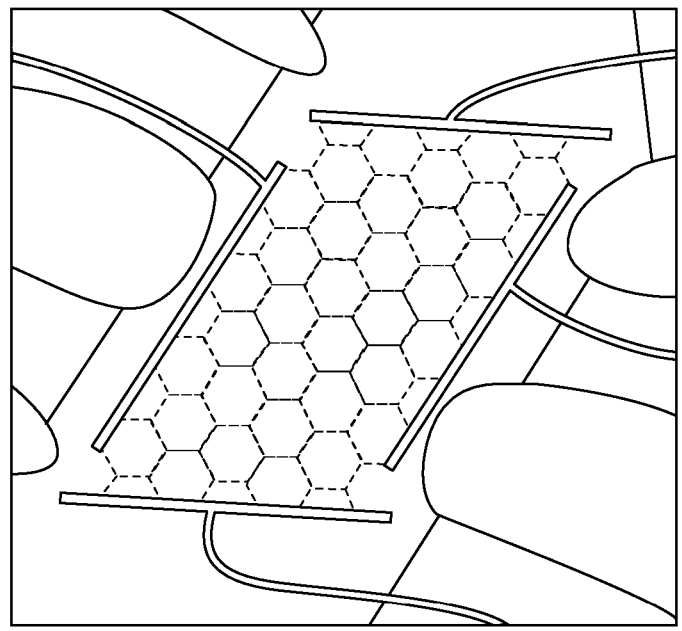
FIG. 11A illustrates a reconfigurable device including a honeycomb pattern in accordance with one or more embodiments shown and described herein.
Figure 11B:
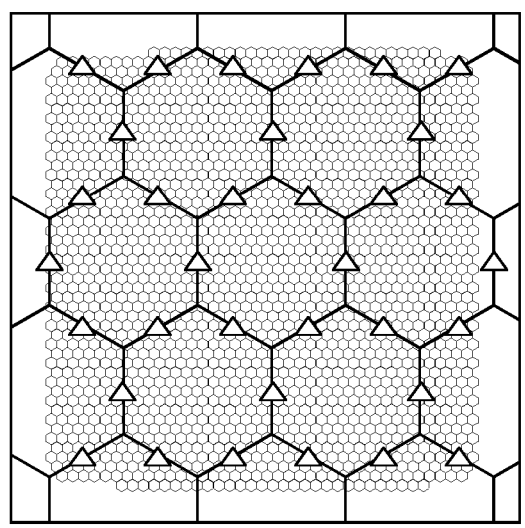
FIG. 11B illustrates a reconfigurable device including a honeycomb pattern in accordance with one or more embodiments shown and described herein.

FIG. 11A illustrates a reconfigurable device including a honeycomb pattern according to an exemplary embodiment. The reconfigurable device may include a Hall bar device with at least one graphene lead. The Hall bar device with graphene leads may be electrically connected by at least one electrode (e.g. Au electrodes) and gated from below by LAO/STO nanostructures. FIG. 11B illustrates a reconfigurable device including a honeycomb pattern according to an exemplary embodiment. The reconfigurable device may include a nonlinear optical modulator based on a 2D array of graphene nanojunctions created using ULV-EBL.

As appreciated from the foregoing, the exemplary oxide heterostructures described herein may be used to facilitate construction of quantum materials. In particular, a ULV-SEM may be employed to create nanostructures as described herein at speeds hundreds of times faster than an atomic force microscope (AFM) or even a thousand (1,000) times faster than an AFM. Nanostructures created with the ULV-SEM may be transferred to a bottom-loading dilution refrigerator for measurements at milli-Kelvin temperatures without breaking vacuum, to prevent air exposure which might alter nanostructure patterns. This approach permits the creation of complex quantum materials of greater size and complexity.

II. Definitions & Terminology

Directional terms as used herein—for example up, down, right, left, front, back, top, bottom, vertical, horizontal—are made only with reference to the figures as drawn and are not intended to imply absolute orientation unless otherwise expressly stated.

Unless otherwise expressly stated, it is in no way intended that any method set forth herein be construed as requiring that its steps be performed in a specific order, nor that with any apparatus specific orientations be required. Accordingly, where a method claim does not actually recite an order to be followed by its steps, or that any apparatus claim does not actually recite an order or orientation to individual components, or it is not otherwise specifically stated in the claims or description that the steps are to be limited to a specific order, or that a specific order or orientation to components of an apparatus is not recited, it is in no way intended that an order or orientation be inferred, in any respect. This holds for any possible non-express basis for interpretation, including: matters of logic with respect to arrangement of steps, operational flow, order of components, or orientation of components; plain meaning derived from grammatical organization or punctuation, and; the number or type of embodiments described in the specification.

As used herein, the singular forms "a," "an" and "the" include plural referents unless the context clearly dictates otherwise. Thus, for example, reference to "a" component includes aspects having two or more such components, unless the context clearly indicates otherwise. Also, the word "or" when used without a preceding "either" (or other similar language indicating that "or" is unequivocally meant to be exclusive—e.g., only one of x or y, etc.) shall be interpreted to be inclusive (e.g., "x or y" means one or both x or y).

The term "and/or" shall also be interpreted to be inclusive (e.g., "x and/or y" means one or both x or y). In situations where "and/or" or "or" are used as a conjunction for a group of three or more items, the group should be interpreted to include one item alone, all the items together, or any combination or number of the items. Moreover, terms used in the specification and claims such as have, having, include, and including should be construed to be synonymous with the terms comprise and comprising. Other elements may optionally be present other than the elements specifically identified by the "and/or" clause, whether related or unrelated to those elements specifically identified. As a non-limiting example, a reference to "X and/or Y" may refer, in one embodiment, to X only (optionally including elements other than Y); in some embodiments, to Y only (optionally including elements other than X); in yet some embodiments, to both X and Y (optionally including other elements).

The drawings shall be interpreted as illustrating one or more embodiments that are drawn to scale and/or one or more embodiments that are not drawn to scale. This means the drawings may be interpreted, for example, as showing: (a) everything drawn to scale, (b) nothing drawn to scale, or (c) one or more features drawn to scale and one or more features not drawn to scale. Accordingly, the drawings may serve to provide support to recite the sizes, proportions, and/or other dimensions of any of the illustrated features either alone or relative to each other. Furthermore, all such sizes, proportions, and/or other dimensions are to be understood as being variable from 0-100% in either direction and thus provide support for claims that recite such values or any and all ranges or subranges that may be formed by such values.

References to specific examples, use of "i.e.," use of the word "invention," etc., are not meant to invoke exception (b) or otherwise restrict the scope of the recited claim terms. Other than situations where exception (b) applies, nothing contained in this document should be considered a disclaimer or disavowal of claim scope.

In addition, where features or aspects of the disclosure are described in terms of Markush groups, those skilled in the art will recognize that the disclosure is also thereby described in terms of any individual member or subgroup of members of the Markush group.

Unless the context indicates otherwise, it is specifically intended that the various features of the invention described herein may be used in any combination. Moreover, the disclosure also contemplates that in some embodiments, any feature or combination of features set forth herein may be excluded or omitted. To illustrate, if the specification states that a complex comprises components A, B and C, it is specifically intended that any of A, B or C, or a combination thereof, may be omitted and disclaimed singularly or in any combination.

As used herein, "about" will be understood by persons of ordinary skill in the art and will vary to some extent depending upon the context in which it is used. If there are uses of the term which are not clear to persons of ordinary skill in the art, given the context in which it is used, "about" will mean up to plus or minus 10% of the particular term.

While certain embodiments have been illustrated and described, it should be understood that changes and modifications may be made therein in accordance with ordinary skill in the art without departing from the technology in its broader aspects as defined in the following claims.

The embodiments, illustratively described herein may suitably be practiced in the absence of any element or elements, limitation or limitations, not specifically disclosed herein. Thus, for example, the terms "comprising," "including," "containing," etc. shall be read expansively and without limitation. Additionally, the terms and expressions employed herein have been used as terms of description and not of limitation, and there is no intention in the use of such terms and expressions of excluding any equivalents of the features shown and described or portions thereof, but it is recognized that various modifications are possible within the scope of the claimed technology. Additionally, the phrase "consisting essentially of" will be understood to include those elements specifically recited and those additional elements that do not materially affect the basic and novel characteristics of the claimed technology. The phrase "consisting of" excludes any element not specified.

The present disclosure is not to be limited in terms of the particular embodiments described in this application. Many modifications and variations may be made without departing from its spirit and scope, as will be apparent to those skilled in the art. Functionally equivalent methods and compositions within the scope of the disclosure, in addition to those enumerated herein, will be apparent to those skilled in the art from the foregoing descriptions. Such modifications and variations are intended to fall within the scope of the appended claims. The present disclosure is to be limited only by the terms of the appended claims, along with the full scope of equivalents to which such claims are entitled. It is to be understood that this disclosure is not limited to particular methods, compounds, or compositions, which may of course vary. It is also to be understood that the terminology used herein is for the purpose of describing particular embodiments only, and is not intended to be limiting.

As will be understood by one skilled in the art, for any and all purposes, particularly in terms of providing a written description, all ranges disclosed herein also encompass any and all possible subranges and combinations of subranges thereof, inclusive of the endpoints. As such, all disclosed ranges are to be understood to encompass and provide support for claims that recite any and all subranges or any and all individual values subsumed by each range. For example, a stated range of 1 to 10 should be considered to include and provide support for claims that recite any and all subranges or individual values that are between and/or inclusive of the minimum value of 1 and the maximum value of 10; that is, all subranges beginning with a minimum value of 1 or more and ending with a maximum value of 10 or less (e.g., 5.5 to 10, 2.34 to 3.56, and so forth) or any values from 1 to 10 (e.g., 3, 5.8, 9.9994, and so forth).

Any listed range may be easily recognized as sufficiently describing and enabling the same range being broken down into at least equal halves, thirds, quarters, fifths, tenths, etc. As a non-limiting example, each range discussed herein may be readily broken down into a lower third, middle third and upper third, etc. As will also be understood by one skilled in the art all language such as "up to," "at least," "greater than," "less than," and the like, include the number recited and refer to ranges which may be subsequently broken down into subranges as discussed above. Further, as will be understood by one skilled in the art, a range includes each individual member. Thus, for example, a group having 1-3 layers refers to groups having 1, 2, or 3 layers. Similarly, a group having 1-5 layers refers to groups having 1, 2, 3, 4, or 5 layers, and so forth.

Any publications, patent applications, issued patents, and other documents referred to in this specification are herein incorporated by reference as if each individual publication, patent application, issued patent, or other document was specifically and individually indicated to be incorporated by reference in its entirety. Definitions that are contained in text incorporated by reference are excluded to the extent that they contradict definitions in this disclosure.

Other embodiments are set forth in the following claims.

What is claimed is:

1. A method, comprising:
   (a) directing an ultra-low voltage electron beam to a surface of a first insulating layer, the first insulating layer disposed on a second insulating layer, the second insulting layer disposed on silicon; and
   (b) modifying, by application of the ultra-low voltage electron beam, the surface of the first insulating layer to selectively switch an interface between a first state having a first electronic property and a second state having a second electronic property, the interface being between the first insulating layer and the second insulating layer.

2. The method of claim 1, wherein the first insulating layer comprises a compound selected from the group consisting of $LaAlO_3$, $SrTiO_3$, $LaVO_3$, $KTaO_3$, $CaZrO_3$, and $\alpha\text{-}Al_2O_3$.

3. The method of claim 1, wherein the second insulating layer comprises a compound selected from the group consisting of $LaAlO_3$, $SrTiO_3$, $LaVO_3$, $KTaO_3$, $CaZrO_3$, and $\alpha\text{-}Al_2O_3$.

4. The method of claim 1, wherein the first insulating layer comprises $SrTiO_3$ and the second insulating layer comprises $LaAlO_3$.

5. The method of claim 1, wherein the first insulating layer comprises $LaAlO_3$ and the second insulating layer comprises $SrTiO_3$.

6. The method of claim 1, wherein the ultra-low voltage electron beam is configured to operate in a range of greater than or equal to 100 V.

7. The method of claim 1, wherein the first state is an insulating state and the second state is a conductive state.

8. The method of claim 1, wherein the first state is a first conductive state and the second state is a second conductive state.

9. The method of claim 1, further comprising directing the ultra-low voltage electron beam through an overlayer disposed on the first insulating layer.

10. The method of claim 9, wherein the overlayer comprises graphene.

11. A reconfigurable device comprising:
    (a) a first insulating layer disposed on a second insulating layer, the second insulating layer disposed on a substrate comprising silicon; and
    (b) an interface between the first insulating layer and the second insulating layer,
    wherein an electronic property of the interface is modifiable in response to an ultra-low voltage electron beam being directed to the first insulating layer.

12. The reconfigurable device of claim 11, wherein the first insulating layer comprises a compound selected from the group consisting of $LaAlO_3$, $SrTiO_3$, $LaVO_3$, $KTaO_3$, $CaZrO_3$, and $\alpha\text{-}Al_2O_3$.

13. The reconfigurable device of claim 11, wherein the second insulating layer comprises a compound selected from the group consisting of $LaAlO_3$, $SrTiO_3$, $LaVO_3$, $KTaO_3$, $CaZrO_3$, and $\alpha\text{-}Al_2O_3$.

14. The reconfigurable device of claim 11, wherein the first insulating layer comprises $SrTiO_3$ and the second insulating layer comprises $LaAlO_3$.

15. The reconfigurable device of claim 11, wherein the first insulating layer comprises $LaAlO_3$ and the second insulating layer comprises $SrTiO_3$.

16. The reconfigurable device of claim 11, wherein the substrate comprises a semiconductor.

17. An electronic assembly comprising:
(a) one or more device electrodes;
(b) one or more interface electrodes configured to be coupled with the one or more device electrodes;
(c) a first insulating layer disposed on a second insulating layer, the second insulating layer disposed on a substrate comprising a semiconductor; and
(d) an interface between the first insulating layer and the second insulating layer, the interface coupled with the one or more interface electrodes,
wherein the electronic assembly is reconfigurable by directing an ultra-low voltage electron beam to the first insulating layer.

18. The electronic assembly of claim 17, wherein the first insulating layer comprises $SrTiO_3$ and the second insulating layer comprises $LaAlO_3$.

* * * * *